United States Patent
Tsuno

(10) Patent No.: US 12,349,531 B2
(45) Date of Patent: Jul. 1, 2025

(54) IMAGING DEVICE

(71) Applicant: Panasonic Intellectual Property Management Co., Ltd., Osaka (JP)

(72) Inventor: Morikazu Tsuno, Shiga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 18/753,873

(22) Filed: Jun. 25, 2024

(65) Prior Publication Data

US 2024/0349525 A1   Oct. 17, 2024

Related U.S. Application Data

(63) Continuation of application No. 17/335,114, filed on Jun. 1, 2021, now Pat. No. 12,048,171, which is a
(Continued)

(30) Foreign Application Priority Data

Dec. 25, 2018   (JP) ................. 2018-241661
Oct. 3, 2019    (JP) ................. 2019-182932

(51) Int. Cl.
  *H10K 39/32*   (2023.01)
  *H10F 39/00*   (2025.01)
  *H10F 39/12*   (2025.01)

(52) U.S. Cl.
  CPC .......... *H10K 39/32* (2023.02); *H10F 39/191* (2025.01); *H10F 39/80373* (2025.01); *H10F 39/802* (2025.01)

(58) Field of Classification Search
  CPC ..... H10K 39/32; H10F 39/191; H10F 39/192; H10F 39/193; H10F 39/802;
(Continued)

(56) References Cited

U.S. PATENT DOCUMENTS

2014/0043510 A1   2/2014 Kasuga et al.
2015/0137199 A1   5/2015 Mori et al.
(Continued)

FOREIGN PATENT DOCUMENTS

JP   2014-216469 A   11/2014
JP   2015-220339 A   12/2015
(Continued)

OTHER PUBLICATIONS

International Search Report of PCT application No. PCT/JP2019/043913 dated Feb. 4, 2020.
(Continued)

*Primary Examiner* — Zandra V Smith
*Assistant Examiner* — Molly K Reida
(74) *Attorney, Agent, or Firm* — Rimon P.C.

(57) ABSTRACT

An imaging device includes a photoelectric converter that converts incident light to charge, a semiconductor substrate that includes an element isolation region and a first impurity region of a first conductivity type, the first impurity region being electrically connected to the photoelectric converter, a plug that includes a first semiconductor, the plug being connected directly to the first impurity region, a pad that includes a second semiconductor, the pad being connected directly to the plug, and a first transistor that includes the first impurity region as one of a source and a drain and includes a first gate. The first impurity region is positioned between the first gate and a first portion of the element isolation region in plan view. The pad overlaps the first gate and the first portion in plan view.

5 Claims, 13 Drawing Sheets

Related U.S. Application Data continuation of application No. PCT/JP2019/043913, filed on Nov. 8, 2019.

(58) Field of Classification Search
CPC ............... H10F 39/803; H10F 39/8037; H10F 39/80373; H10F 39/80377
See application file for complete search history.

(56) References Cited

U.S. PATENT DOCUMENTS

| | | |
|---|---|---|
| 2015/0334320 A1 | 11/2015 | Sasaki |
| 2018/0331140 A1 | 11/2018 | Sato |
| 2019/0027524 A1 | 1/2019 | Sato et al. |
| 2019/0371839 A1 | 12/2019 | Sato et al. |

FOREIGN PATENT DOCUMENTS

| | | |
|---|---|---|
| JP | 2018-195803 A | 12/2018 |
| WO | 2012/147302 A1 | 11/2012 |
| WO | 2014/002332 A1 | 1/2014 |

OTHER PUBLICATIONS

Notice of Allowance dated Mar. 27, 2024 issued in U.S. Appl. No. 17/335,114.

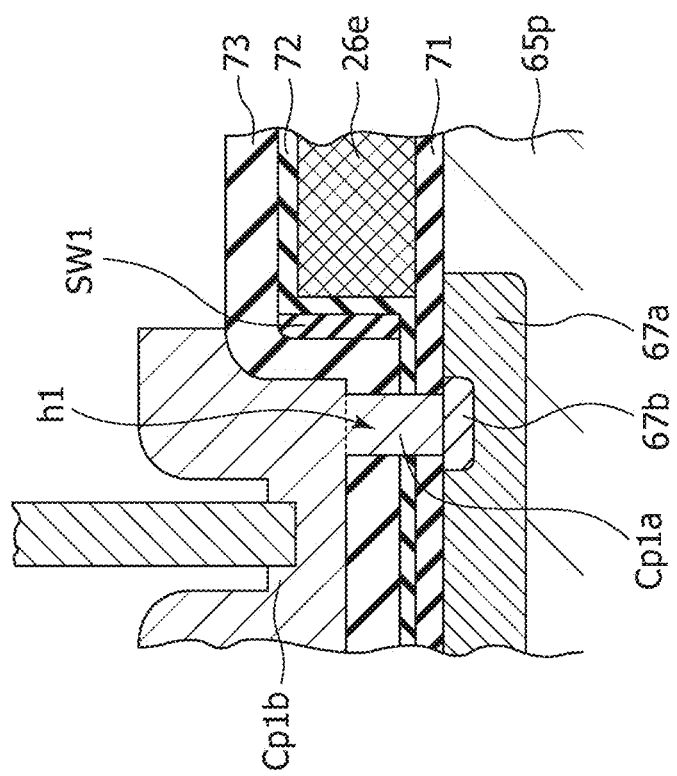
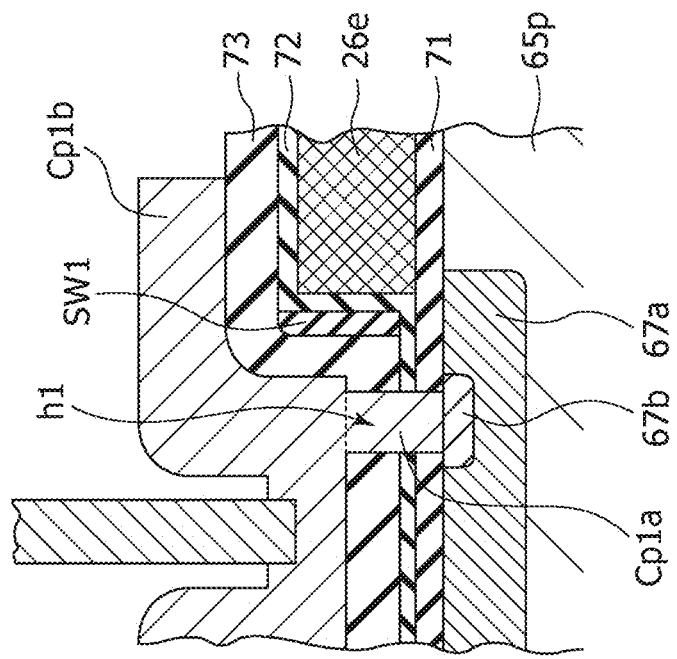
FIG. 13A
FIG. 13B

IMAGING DEVICE

CROSS-REFERENCE OF RELATED APPLICATIONS

This application is a Continuation Application of U.S. patent application Ser. No. 17/335,114, filed on Jun. 1, 2021, which is a Continuation Application of International Patent Application No. PCT/JP2019/043913, filed on Nov. 8, 2019, which claims the benefit of Japanese Patent Application No. 2018-241661, filed on Dec. 25, 2018, and Japanese Patent Application No. 2019-182932, filed on Oct. 3, 2019, the entire contents of each are hereby incorporated by reference.

BACKGROUND

1. Technical Field

The present disclosure relates to an imaging device.

2. Description of the Related Art

Charge coupled device (CCD) image sensors and complementary metal-oxide semiconductor (CMOS) image sensors are widely used in digital cameras. These image sensors have photodiodes formed at a semiconductor substrate.

In another structure proposed as disclosed in, for example, International Publication No. WO2012/147302, a photoelectric conversion layer instead of photodiodes is disposed above a semiconductor substrate. An imaging device having this type of structure may also be referred to as a multilayer imaging device. In a multilayer imaging device, charge generated by photoelectric conversion is temporarily accumulated as signal charge in a diffusion region formed at the semiconductor substrate. A signal that corresponds to the amount of accumulated charge is read through a CCD circuit or CMOS circuit formed at the semiconductor substrate.

SUMMARY

One non-limiting and exemplary embodiment provides an imaging device.

In one general aspect, the techniques disclosed here feature an imaging device that includes: a photoelectric converter that converts incident light to charge; a semiconductor substrate that includes an element isolation region and a first impurity region of a first conductivity type, the first impurity region being electrically connected to the photoelectric converter; a plug that includes a first semiconductor, the plug being connected directly to the first impurity region; a pad that includes a second semiconductor, the pad being connected directly to the plug; and a first transistor that includes the first impurity region as one of a source and a drain and includes a first gate. The first impurity region is positioned between the first gate and a first portion of the element isolation region in plan view. The pad overlaps the first gate and the first portion in plan view.

It should be noted that comprehensive or specific aspects may be implemented as an element, a device, a module, a system, a method, or any selective combination of an element, a device, an apparatus, a module, a system, and a method.

Additional benefits and advantages of the disclosed embodiments will become apparent from the specification and drawings. The benefits and/or advantages may be individually obtained by the various embodiments or features disclosed in the specification and drawings, which need not all be provided in order to obtain one or more of such benefits and/or advantages.

BRIEF DESCRIPTION OF THE DRAWINGS

FIGS. 13A and 13B each are a sectional view referenced to explain the position of the end of a pad in the device structure of the pixel in the imaging device in each variation of the present disclosure.

DETAILED DESCRIPTION

Outline of the Present Disclosure

Figure 1:
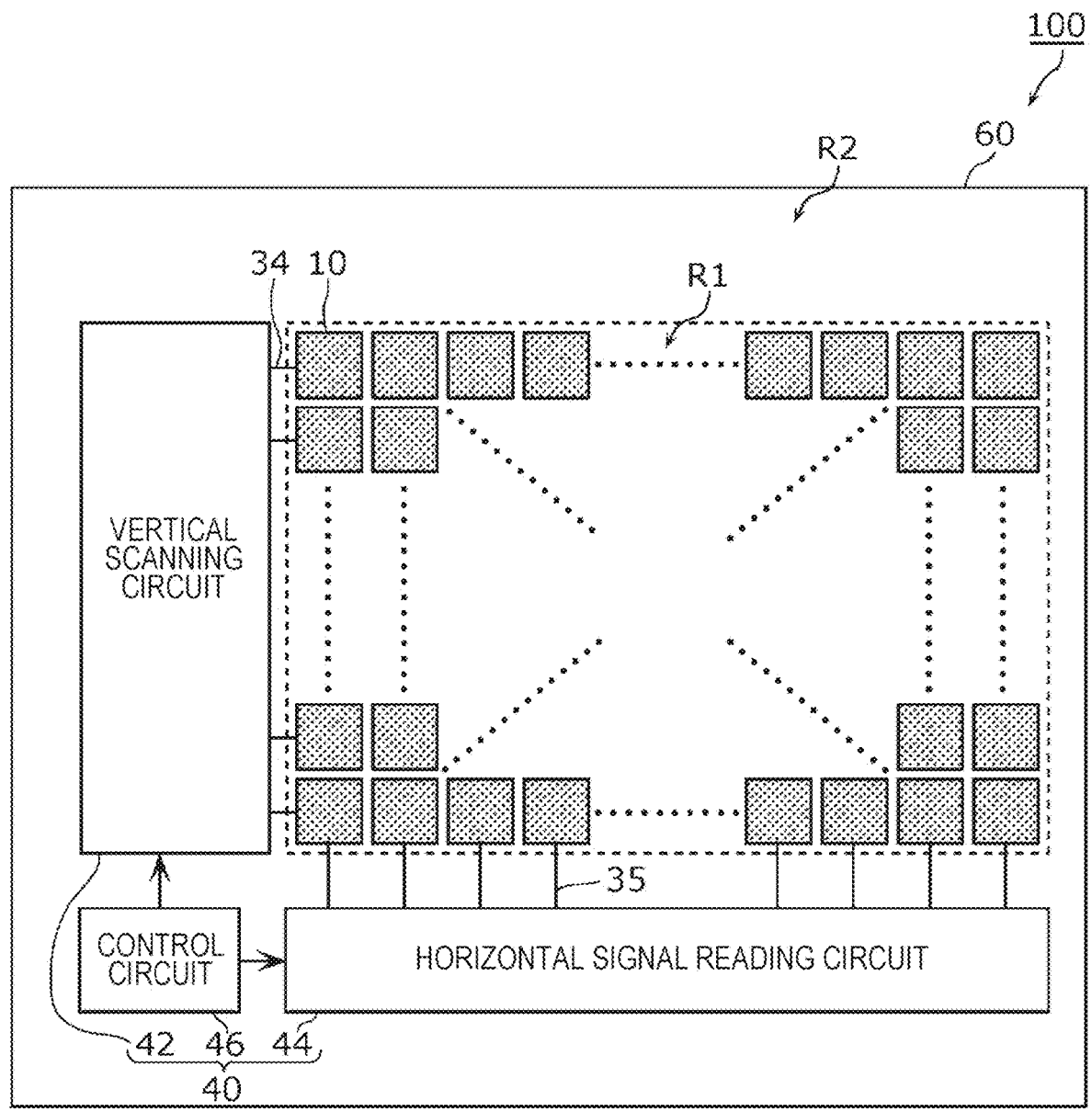
FIG. 1 illustrates an exemplary structure of an imaging device according to Embodiment 1 of the present disclosure.

One aspect of the present disclosure will be described below.

When charge other than signal charge enters a diffusion area that temporarily holds signal charge, noise may be generated. The noise may lower the quality of an obtained image. Therefore, it is beneficial to suppress the travel of this type of unintended charge. In the description below, the travel of this type of unintended charge may be referred to as a dark current (also referred to as a leak current).

A dry etching apparatus may be used to pattern wires and contact plugs that include a semiconductor. During this patterning, small crystal defects may be generated due to plasma damage in regions, on the front surface side of the semiconductor substrate, that are not covered by wires or contact plugs. If small crystal defects are generated in an impurity region connected to a photoelectric converter, a dark current flows into the impurity region, which may cause noise.

In view of this, an imaging device according to one aspect of the present disclosure includes: a photoelectric converter that converts incident light to charge; a semiconductor substrate that includes an element isolation region and a first impurity region of a first conductivity type, the first impurity region being electrically connected to the photoelectric converter; a plug that includes a first semiconductor, the plug being connected directly to the first impurity region; a pad that includes a second semiconductor, the pad being connected directly to the plug; and a first transistor that includes the first impurity region as one of a source and a drain and includes a first gate. The first impurity region is positioned between the first gate and a first portion of the element isolation region in plan view. The pad overlaps the first gate and the first portion in plan view.

An imaging device according to another aspect of the present disclosure includes: a photoelectric converter that converts incident light to charge; a semiconductor substrate that includes an element isolation region and a first impurity region of a first conductivity type, the first impurity region being electrically connected to the photoelectric converter; a plug that includes a first semiconductor, the plug being connected directly to the first impurity region; a pad that includes a second semiconductor, the pad being connected directly to the plug; a first transistor that includes the first impurity region as one of a source and a drain and includes a first gate; and a side wall positioned in a lateral direction of the first gate. The first impurity region is positioned between the first gate and a first portion of the element isolation region in plan view. The pad overlaps the side wall and the first portion in plan view.

Thus, in the imaging device according to any aspect above, the pad can cover at least part of the first impurity region in plan view. This makes it possible to suppress plasma damage to the first impurity region in a dry etching process in which the pad is patterned. Therefore, it is possible to suppress generation of a crystal defect in the first impurity region and it is possible to suppress a dark current that flows into or out of the first impurity region.

For example, the element isolation region may be an impurity region of a second conductivity type different from the first conductivity type.

Thus, the element isolation region can be easily formed by ion implantation. Since an ion implantation range can be precisely controlled, the element isolation region can be easily formed in a desired shape. This enables a highly reliable imaging device to be implemented.

For example, in the imaging device according to the one aspect and other aspect above in the present disclosure, the element isolation region may further include a second portion in contact with the first portion and a third portion in contact with the first portion. The first impurity region may be positioned between the second portion and the third portion in plan view. The pad may overlap the second portion and the third portion in plan view. In this case, when, in plan view, the first gate is positioned in a first direction of the first impurity region and the first portion is positioned in a second direction of the first impurity region, the second direction being opposite to the first direction, for example, the second portion may be positioned in a third direction of the first impurity region, the third direction crossing the first direction, and the third portion may be positioned in a fourth direction of the first impurity region, the fourth direction being opposite to the third direction.

Thus, the pad can completely cover the first impurity region. This makes it possible to further suppress plasma image to the first impurity region in a dry etching process. Therefore, it is possible to further suppress a dark current that flows into or out of the first impurity region.

For example, an imaging device according to another aspect of the present disclosure includes: a photoelectric converter that converts incident light to charge; a semiconductor substrate that includes a first impurity region of a first conductivity type, the first impurity region being electrically connected to the photoelectric converter; a plug that includes a first semiconductor, the plug being connected directly to the first impurity region; a pad that includes a second semiconductor, the pad being connected directly to the plug; a first transistor that includes the first impurity region as one of a source and a drain and includes a first gate; and a second gate that overlaps the first impurity region in plan view. The pad overlaps the first gate and the second gate in plan view.

An imaging device according to another aspect of the present disclosure includes: a photoelectric converter that converts incident light to charge; a semiconductor substrate that includes a first impurity region of a first conductivity type, the first impurity region being electrically connected to the photoelectric converter; a plug that includes a first semiconductor, the plug being connected directly to the first impurity region; a pad that includes a second semiconductor, the pad being connected directly to the plug; a first transistor that includes the first impurity region as one of a source and a drain and includes a first gate; a first side wall positioned in a lateral direction of the first gate; a second gate that overlaps the first impurity region in plan view; and a second side wall positioned in a lateral direction of the second gate. The pad overlaps the first side wall and the second side wall in plan view.

Thus, in the imaging device in any aspect above, the pad can cover at least part of the first impurity region in plan view. This makes it possible to suppress plasma damage to the first impurity region in a dry etching process. Therefore, it is possible to suppress generation of a crystal defect in the first impurity region and it is possible to suppress a dark current that flows into or out of the first impurity region.

For example, the imaging device according to the other aspects above in the present disclosure may further include a second transistor that includes the first impurity region as one of a source and a drain and includes the second gate.

Thus, it is possible to provide a protective transistor used to discharge charge that may otherwise be excessively accumulated in the impurity region. Alternatively, it is possible to provide a reset transistor used to reset charge accumulated in the impurity region.

For example, in the imaging device according to the other aspects above in the present disclosure, the semiconductor substrate may further include an element isolation region; the element isolation region may include a second portion and a third portion; the first impurity region may be positioned between the second portion and the third portion in plan view; and the pad may overlap the second portion and the third portion in plan view. In this case, when, in plan view, the first gate is positioned in a first direction of the first impurity region and the second gate is positioned in a second direction of the first impurity region, the second direction being opposite to the first direction, for example, the second portion may be positioned in a third direction of the first impurity region, the third direction crossing the first direction, and the third portion may be positioned in a fourth direction of the first impurity region, the fourth direction being opposite to the third direction.

Thus, the pad can completely cover the first impurity region. This makes it possible to further suppress plasma image to the first impurity region in a dry etching process. Therefore, it is possible to further suppress a dark current that flows into or out of the first impurity region.

For example, each of the second portion and the third portion may be an impurity region of a second conductivity type different from the first conductivity type.

Thus, the second portion and third portion can be easily formed by ion implantation. Since an ion implantation range can be precisely controlled, the second portion and third portion can be easily formed in a desired shape. This enables a highly reliable imaging device to be implemented.

For example, the first semiconductor and the second semiconductor may be polysilicon.

Thus, it is possible to suppress diffusion of a metal to a diffusion region or insulating film and it is possible to suppress generation of a dark current. This is unlike when a metal is used.

Embodiments of the present disclosure will be described below in detail with reference to the drawings.

All embodiments described below illustrate general or specific examples. Numerals, shapes, materials, constituent elements, the placement positions and connection forms of these constituent elements, steps, the sequence of these steps, and the like are only examples, and are not intended to restrict the present disclosure. Various aspects described in this specification can be mutually combined unless any contradiction occurs. Of the constituent elements described in the embodiments below, constituent elements not described in independent claims will be described as optional constituent elements. In the description below, constituent elements having essentially the same function will be given the same reference characters and descriptions will sometimes be omitted. To prevent the drawings from becoming excessively complex, part of elements may be omitted in the drawings.

Various elements in the drawings are merely illustrated schematically for understanding of the present disclosure. For example, dimensional ratios, outside shapes, and the like may differ from the actuality. That is, each drawing is a schematic drawing and is not necessarily drawn in a rigorous manner. Therefore, scales and the like do not necessarily match among the drawings.

In this specification, terms indicating a relationship among elements such as, for example, "parallel" and "match", terms indicating shapes of elements such as, for example, a rectangle, and numerical ranges are not representations indicating only restrict means. They are representations meaning that an essentially equivalent range is also included; for example, these representations mean that a difference of several percent is also included.

In this specification, the terms "upward" and "downward" do not respectively indicate the upward direction (vertically upward) and the downward direction (vertically downward) in absolute spatial awareness, but are used as terms stipulated by a relative positional relationship according to the lamination sequence in a multilayer structure. Specifically, the light receiving side of the imaging device is the upward side and the side opposite to the right receiving side is the downward side. This is also true for the upper surface and lower surface of each member. The member's surface facing the light receiving side of the imaging element is the upper surface, and the member's surface opposite to the light receiving side is the lower surface. The terms such as, for example, "upward", "downward", "upper surface", "lower surface", and the like are merely used to specify a mutual placement among members, and are not used to intend to restrict the orientation of the imaging device during its usage. The terms "upward" and "downward" are used not only when two constituent elements are disposed so as to be spaced from each other and another constituent element is present between the two constituent elements but also when two constituent elements are disposed so as to be in tight contact with each other. In this specification, the term "plan view" refers to viewing in a direction perpendicular to the semiconductor substrate.

Embodiment 1

FIG. 1 illustrates an exemplary structure of an imaging device according to Embodiment 1 of the present disclosure. The imaging device 100 in FIG. 1 has pixels 10 and peripheral circuits 40 that are formed on a semiconductor substrate 60.

In the example in FIG. 1, pixels 10 are arranged in a matrix of m rows and n columns. Each of the numbers m and n is an integer greater than or equal to 1. Pixels 10, for example, two-dimensionally arranged on the semiconductor substrate 60 form an imaging area R1.

The number and arrangement of pixels 10 are not limited to the example illustrated in the drawing. For example, the number of pixels 10 included in the imaging device 100 may be 1. Although, in the example in the drawing, the center of each pixel 10 is positioned on the lattice point of a square lattice, this is not a limitation. For example, pixels 10 may be arranged so that the center of each pixel 10 is positioned on the lattice point of a triangular lattice or hexagonal lattice. For example, pixels 10 may be one-dimensionally arranged. In this case, the imaging device 100 can be used as a line sensor.

In the structure illustrated in FIG. 1, the peripheral circuits 40 include a vertical scanning circuit 42 and a horizontal signal reading circuit 44. The peripheral circuits 40 can additionally include a control circuit 46 as illustrated in FIG. 1. The peripheral circuits 40 can further include, for example, a voltage supply circuit that supplies a predetermined voltage to, for example, pixels 10, as will be described later. The peripheral circuits 40 may further include a signal processing circuit or an output circuit.

The peripheral circuits 40 are provided in, for example, a peripheral region R2 allocated around an imaging area R1. Although, in the example in FIG. 1, the peripheral region R2 is a ring-shaped region that encloses the periphery of the imaging area R1, this is not a limitation. The peripheral region R2 may be an L-shaped region along two edges of the imaging area R1 or an elongated area along one edge of the imaging area R1.

The vertical scanning circuit 42, also referred to as the row scanning circuit, has connections to address signal lines 34 provided in a one-to-one correspondence with the rows of pixels 10. Signal lines provided in a one-to-one correspondence with the rows of pixels 10 are not limited to the address signal lines 34. Plural types of signal lines can be connected to the vertical scanning circuit 42 for each row of pixels 10, as will be described later. The horizontal signal reading circuit 44, also referred to as the column scanning circuit, has connections to vertical signal lines 35 provided in a one-to-one correspondence with the columns of pixels 10.

The control circuit 46 receives, for example, command data and a clock given from, for example, the outside of the imaging device 100, and controls the whole of the imaging device 100. Typically, the control circuit 46 has a timing generator to supply a driving signal to the vertical scanning circuit 42, the horizontal signal reading circuit 44, and a voltage supply circuit described later. In FIG. 1, each arrow extending from the control circuit 46 schematically represents a flow of an output signal from the control circuit 46. The control circuit 46 can be implemented by, for example, a microcontroller including at least one processor. The functions of the control circuit 46 may be implemented by a combination of a general-purpose processing circuit and software or by hardware specific to relevant processing.

Figure 2:
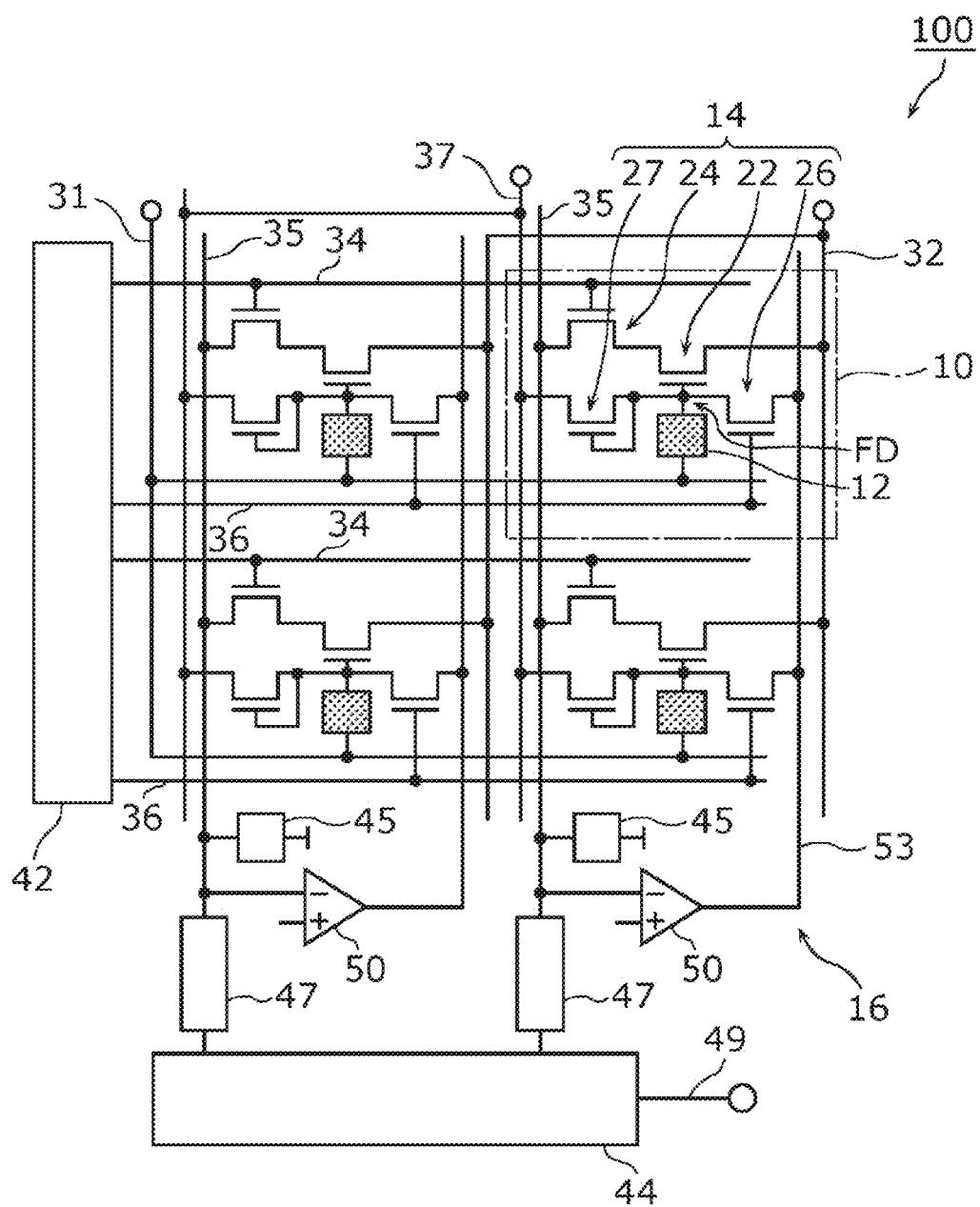
FIG. 2 schematically illustrates an exemplary circuit structure of the imaging device according to Embodiment 1 of the present disclosure.

FIG. 2 schematically illustrates an exemplary circuit structure of the imaging device 100 according to Embodiment 1 of the present disclosure. In FIG. 2, to simplify the drawing, four pixels 10 are illustrated in a matrix of two rows and two columns as typified pixels 10. Each of these pixels 10 is an example of the pixel 10 illustrated in FIG. 1. Each pixel 10 includes a photoelectric converter 12 and a signal detection circuit 14 electrically connected to the photoelectric converter 12.

The photoelectric converter 12 receives incident light and generates positive and negative charge, typically hole-electron pairs. The photoelectric converter 12 can have a photoelectric conversion structure including a photoelectric conversion layer disposed above the semiconductor substrate 60 or can be photodiodes formed on the semiconductor substrate 60. The photoelectric converters 12 in all pixels 10 are contiguously disposed above the semiconductor substrate 60 without a clearance between each two adjacent pixels 10. Alternatively, the photoelectric converters 12 in all pixels 10 may be spatially separated from one another. The photoelectric converter 12 includes a photoelectric conversion layer 12b disposed above the semiconductor substrate 60, as will be described in detail with reference to FIG. 3. That is, a multilayer imaging device will be described here as an example of the imaging device 100. When each pixel 10 has the photoelectric converter 12 disposed above the semiconductor substrate 60, the imaging area R1 illustrated in FIG. 1 can be stipulated as a region covered by the photoelectric converters 12, the region being part of the semiconductor substrate 60.

The photoelectric converter 12 in each pixel 10 has a connection to an accumulation control line 31. During operation of the imaging device 100, a predetermined voltage is applied to the accumulation control line 31. When positive and negative charge are generated by photoelectric conversion and positive charge of them, for example, is used as signal charge, a positive voltage of about 10 V can be applied to the accumulation control line 31 during operation of the imaging device 100. An example in which positive holes are used as signal charge will be described below.

In the structure illustrated in FIG. 2, the signal detection circuit 14 includes a signal detection transistor 22, an address transistor 24, a reset transistor 26, and a protective transistor 27. Typically, the signal detection transistor 22, address transistor 24, reset transistor 26, and protective transistor 27 are each a field effect transistor (FET) formed on the semiconductor substrate 60, which supports the photoelectric converters 12, as will be described later in detail with reference to the relevant drawing. Unless otherwise noted in the description below, an example will be described in which an N-channel metal oxide semiconductor field-effect transistor (MOSFET) is used as a transistor.

As schematically illustrated in FIG. 2, the gate of the signal detection transistor 22 is electrically connected to the photoelectric converter 12. In the example in the drawing, a charge accumulation node FD, which connects the gate of the signal detection transistor 22 to the photoelectric converter 12, has a function for temporarily holding charge generated by the photoelectric converter 12. When a predetermined voltage is applied to the accumulation control line 31 during operation, positive holes, for example, can be accumulated in the charge accumulation node FD as signal charge. The charge accumulation node FD includes an impurity region formed in the semiconductor substrate 60 as part of the charge accumulation node FD, as will be described later in detail with reference to the relevant drawing.

One of the drain and source of the signal detection transistor 22 is connected to a power supply line 32. During operation of the imaging device 100, the power supply line 32 supplies a power supply voltage VDD1 to each pixel 10. The power supply voltage VDD1 is, for example, 3.3 V. The other of the drain and source of the signal detection transistor 22 is connected to a vertical signal line 35 through the address transistor 24. When a power supply voltage VDD is supplied to the other of the drain and source of the signal detection transistor 22, it outputs a signal voltage matching the amount of signal charge accumulated in the charge accumulation node FD.

The address signal line 34 is connected to the gate of the address transistor 24 connected between the signal detection transistor 22 and the vertical signal line 35. The vertical scanning circuit 42 applies a row selection signal, which controls the address transistor 24 so as to be turned on or off, to the address signal line 34. Thus, an output from the signal detection transistor 22 in the selected pixel 10 can be sent to the relevant vertical signal line 35. The placement of the address transistor 24 is not limited to the example in FIG. 2. The address transistor 24 may be disposed between the power supply line 32 and the drain of the signal detection transistor 22.

One of the gate and source of the protective transistor 27 is connected to the charge accumulation node FD. The other of the gate and source of the protective transistor 27 is connected to a power supply line 37. During operation of the imaging device 100, the power supply line 37 supplies a power supply voltage VDD2 to each pixel 10. The power supply voltage VDD2 is, for example, 2.0 V. When high-intensity light is incident on the photoelectric converter 12, more holes are accumulated in the charge accumulation node FD. In this case, a bias higher than, for example, 5 V may be generated in the charge accumulation node FD, and the gate oxide film of the signal detection transistor 22 connected to the charge accumulation node FD may thereby be broken. To prevent this, if a high bias higher than, for example, 5V is generated in the charge accumulation node FD, the protective transistor 27 is brought into conduction. Accordingly, holes accumulated in the charge accumulation node FD are discharged and the potential of the charge accumulation node FD can be lowered.

A load circuit 45 and a column signal processing circuit 47 are connected to each vertical signal line 35. The load circuit 45 forms a source follower circuit together with the signal detection transistor 22. The column signal processing circuit 47, also referred to as the row signal accumulation circuit, performs analog-digital conversion and noise suppression signal processing typified in correlated double sampling, for example. The horizontal signal reading circuit 44 reads signals from column signal processing circuits 47 and outputs the signals to a horizontal common signal line 49 in succession. The load circuit 45 and column signal processing circuit 47 can be part of the peripheral circuits 40 described above.

A reset signal line 36 having a connection to the vertical scanning circuit 42 is connected to the gates of reset transistors 26. One reset signal line 36 is provided for each row of pixels 10 similarly to the address signal line 34. The vertical scanning circuit 42 can select a row of pixels 10 to be reset by applying a row selection signal to the relevant address signal line 34. The vertical scanning circuit 42 can selectively turn on and off each reset transistor 26 in the selected row by applying the reset signal to the reset transistor 26 through the reset signal line 36. When the reset transistor 26 is turned on, the potential of the charge accumulation node FD is reset.

In this example, one of the drain and source of the reset transistor 26 is connected to the charge accumulation node FD, and the other of the drain and source is connected to feedback line 53 that is the relevant one of feedback lines 53 provided for columns of pixels 10, one for each column. That is, in this example, the voltage of the feedback line 53 is supplied to the charge accumulation node FD as the reset voltage that initializes charge in the photoelectric converter 12.

In the structure illustrated in FIG. 2, the imaging device 100 has a feedback circuit 16 that includes an inverting amplifier 50 as part of a feedback path. One inverting amplifier 50 is provided for each column of pixels 10, as illustrated in FIG. 2. The feedback line 53 described above is connected to the output terminal of the relevant one of the inverting amplifiers 50. The inverting amplifier 50 can be part of the peripheral circuits 40 described above.

The inverting input terminal of the inverting amplifier 50 is connected to the vertical signal line 35 of the relevant column, as illustrated in FIG. 2. During operation of the imaging device 100, a reference voltage Vref is supplied to the non-inverting input terminal of the inverting amplifier 50. When the address transistor 24 and reset transistor 26 are turned on, a feedback path can be formed through which an output from the relevant pixel 10 can be negatively fed back. When the feedback path is formed, the voltage of the vertical signal line 35 converges to the reference voltage Vref, which is an input voltage supplied to the non-inverting input terminal of the inverting amplifier 50. In other words, when the feedback path is formed, the voltage at the charge accumulation node FD is reset to a voltage by which the voltage of the vertical signal line 35 becomes the reference voltage Vref. The power supply voltage or a voltage with any magnitude within the range of the restrictions on grounding can be used as the reference voltage Vref. The reference voltage Vref is, for example, 1 V or a positive voltage around 1 V. The formation of the feedback path makes it possible to reduce reset noise that is generated when the reset transistor 26 is turned off.

Device Structure of the Pixel 10

Next, the device structure of the pixel 10 will be described in detail with reference to FIGS. 3 and 4.

Figure 3:
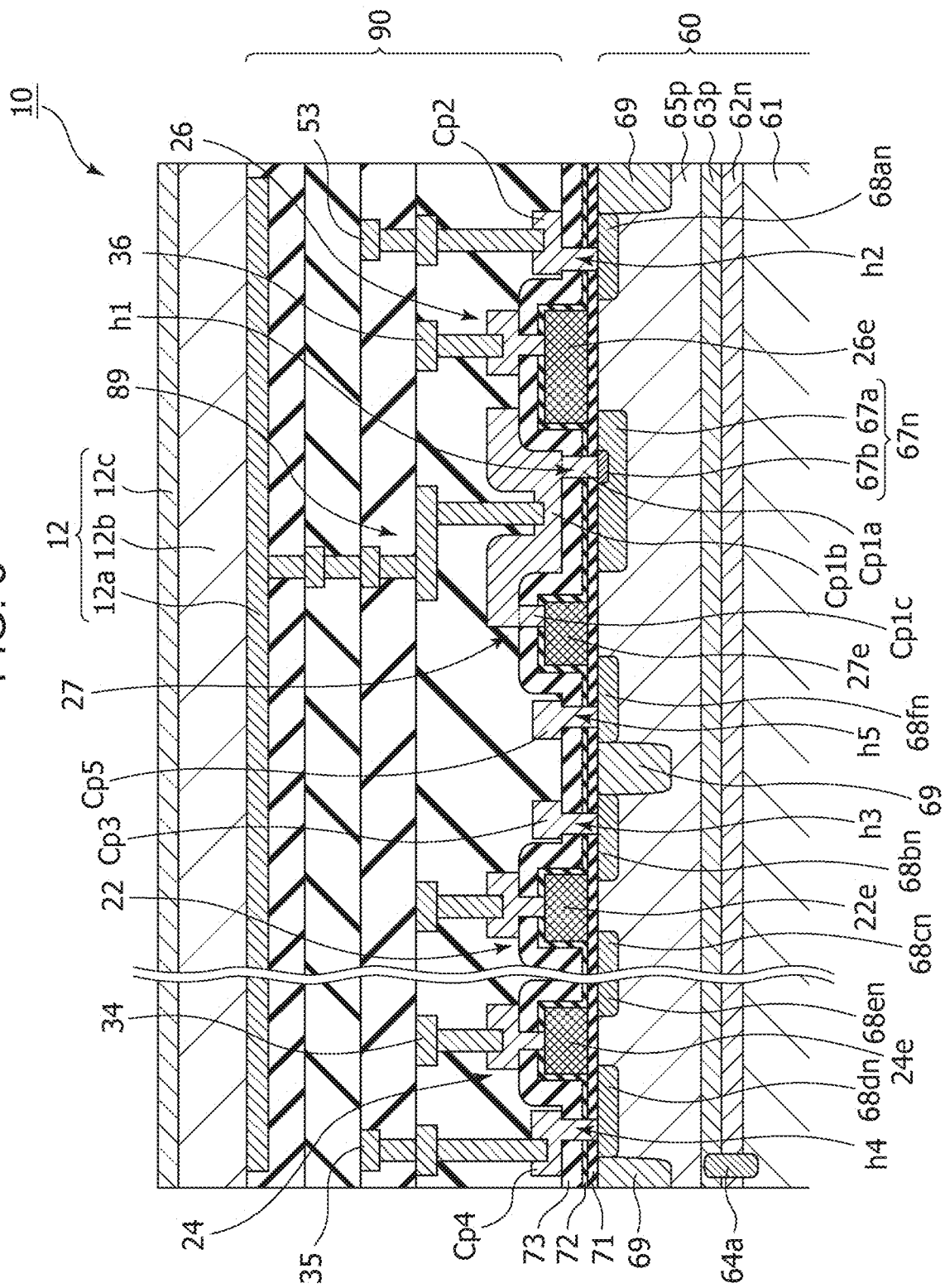
FIG. 3 is a sectional view schematically illustrating an example of the device structure of a pixel in the imaging device according to Embodiment 1 of the present disclosure.

FIG. 3 is a sectional view schematically illustrating an example of the device structure of the pixel 10 in the imaging device 100 according to Embodiment 1 of the present disclosure. FIG. 4 is a plan view schematically illustrating an example of the layout of the elements in the pixel 10 in the imaging device 100 according to Embodiment 1.

In FIG. 3, for convenience of explanation, the signal detection transistor 22, address transistor 24, protective transistor 27, and reset transistor 26 are illustrated so that they appear in one cross section. Therefore, there may be a portion that differs between the cross section in FIG. 3 and a cross section obtained by cutting the element layout in FIG. 4 along a line.

The pixel 10 formed on the semiconductor substrate 60 includes the photoelectric converter 12, and a conductive structure 89. As illustrated in the drawing, the photoelectric converter 12 is positioned above the semiconductor substrate 60. The photoelectric converter 12 is supported by an insulating interlayer 90 that covers the semiconductor substrate 60. The conductive structure 89 is disposed in the insulating interlayer 90. In the example illustrated in the drawing, the insulating interlayer 90 includes insulating layers, and the conductive structure 89 includes part of each of wiring layers disposed in the insulating interlayer 90. The wiring layers can include, for example, wiring layers that include at least one of the address signal line 34, reset signal line 36, vertical signal line 35, power supply line 32, power supply line 37, and feedback line 53 as part of the wiring layers. It will be appreciated that the numbers of insulating layers and wiring layers in the insulating interlayer 90 are not limited to this example. Any numbers of insulating layers and wiring layers can be set.

The photoelectric converter 12 includes a pixel electrode 12a formed on the insulating interlayer 90, an opposing electrode 12c disposed on a side on which light is incident, and a photoelectric conversion layer 12b disposed between the pixel electrode 12a and the opposing electrode 12c. The photoelectric conversion layer 12b is formed from an organic material or inorganic material. An example of an inorganic material is amorphous silicon. The photoelectric conversion layer 12b receives incident light through the opposing electrode 12c and generates positive and negative charge by photoelectric conversion. Typically, the photoelectric conversion layer 12b is continuously formed across pixels 10. Specifically, the photoelectric conversion layer 12b is formed like a single flat plate that covers most of the imaging area R1 on the semiconductor substrate 60 in plan view. That is, the photoelectric conversion layer 12b is shared by pixels 10. In other words, the photoelectric converter 12 provided for each pixel 10 has a portion of the photoelectric conversion layer 12b, the portion being different for each pixel 10. The photoelectric conversion layer 12b may include a layer formed from an organic material and a layer formed from an inorganic material. The photoelectric conversion layer 12b may be provided separately for each pixel 10.

The opposing electrode 12c is a transparent electrode formed from a transparent conductive material. An example of a transparent conductive material is an indium tin oxide (ITO) material. The term "transparent" in this specification means that the photoelectric conversion layer 12b transmits at least part of light having a wavelength that can be absorbed by the photoelectric conversion layer 12b. It is not essential that the photoelectric conversion layer 12b transmits light across the entire wavelength range of visible light. Typically, the opposing electrode 12c is continuously formed across pixels 10 similarly to the photoelectric conversion layer 12b. That is, the opposing electrode 12c is shared by pixels 10. In other words, the photoelectric converter 12 provided for each pixel 10 has a portion of the opposing electrode 12c, the portion being different for each pixel 10. The opposing electrode 12c may be provided separately for each pixel 10.

Although not illustrated in FIG. 3, the opposing electrode 12c has a connection to the accumulation control line 31. During operation of the imaging device 100, when the potential of the accumulation control line 31 is controlled so that the potential of the opposing electrode 12c becomes higher than the potential of the pixel electrode 12a, positive charge can be selectively collected by the pixel electrode 12a from positive charge and negative charge generated by photoelectric conversion. When the opposing electrode 12c is formed across pixels 10 in the form of a continuous single layer, a predetermined potential can be concurrently applied to the opposing electrode 12c of the pixels 10.

The pixel electrode 12a is formed from, for example, a metal, a metal nitride, or polysilicon to which conductivity is added by being doped with an impurity. The metal referred to here is, for example, aluminum or copper. Since the pixel electrode 12a is spatially separated from the pixel electrodes 12a of adjacent other pixels 10, the pixel electrode 12a is electrically separated from the pixel electrodes 12a of the adjacent other pixels 10.

The conductive structure 89 includes wires and contact plugs. One end of the conductive structure 89 is connected to the pixel electrode 12a. Another end of the conductive structure 89 is connected to a charge accumulation region 67n described later. The wires may be formed from, for example, a metal such as copper or tungsten or a metal compound such as a metal nitride or metal oxide. The wires and the contact plugs may be formed from polysilicon to which conductivity is added, as will be described later. When the other end of the conductive structure 89 is connected to a circuit element formed on the semiconductor substrate 60, the pixel electrode 12a of the photoelectric converter 12 and the circuit on the semiconductor substrate 60 are electrically connected to each other.

Now, attention will be focused on the semiconductor substrate 60. As schematically illustrated in FIG. 3, the semiconductor substrate 60 includes a support substrate 61 and one or more semiconductor layers formed on the support substrate 61. As one or more semiconductor layers, the semiconductor substrate 60 has an n-type semiconductor layer 62n formed on the support substrate 61, a p-type semiconductor layer 63p formed on the n-type semiconductor layer 62n, and a p-type semiconductor layer 65p formed on the p-type semiconductor layer 63p.

The semiconductor substrate 60 has a first surface and a second surface opposite to the first surface. Light is incident on the first surface. Specifically, of surfaces of the semiconductor substrate 60, the first surface is a surface on the same side as the photoelectric converter 12. In this specification, the front surface of the semiconductor substrate 60 is equivalent to the first surface, and the rear surface of the semiconductor substrate 60 is equivalent to the second surface. Although not illustrated in FIG. 3, the surface, on the same side as the support substrate 61, of the semiconductor substrate 60 is the second surface.

In this embodiment, the support substrate 61 is exemplified by a p-type silicon substrate. A p-type impurity included in the support substrate 61 is, for example, boron.

The support substrate 61 has a connection to a substrate contact (not illustrated in FIG. 3) provided outside the imaging area R1. The support substrate 61 is connected to the p-type semiconductor layer 63p through a p-type region 64a, as will be described later. During operation of the imaging device 100, the potentials of the support substrate 61 and p-type semiconductor layer 63p are controlled through the substrate contact. When the p-type semiconductor layer 65p is disposed so as to be in contact with the p-type semiconductor layer 63p, the potential of the p-type semiconductor layer 65p can be controlled through the p-type semiconductor layer 63p during operation of the imaging device 100.

The n-type semiconductor layer 62n is provided closer to the front surface of the semiconductor substrate 60 than the support substrate 61 is. An n-type impurity included in the n-type semiconductor layer 62n is, for example, phosphorus. Specifically, the n-type semiconductor layer 62n is positioned between the support substrate 61 and the p-type semiconductor layer 63p. More specifically, the n-type semiconductor layer 62n is provided so as to be in contact with the upper surface of the support substrate 61.

Although not illustrated in FIG. 3, a well contact (not illustrated) is connected to the n-type semiconductor layer 62n. The well contact is provided outside the imaging area R1. During operation of the imaging device 100, the potential of the n-type semiconductor layer 62n is controlled through the well contact. The n-type semiconductor layer 62n is provided to suppress a flow of minority carriers from the support substrate 61 or peripheral circuits 40 into the charge accumulation region 67n, which accumulates signal charge. That is, since the n-type semiconductor layer 62n is provided between the support substrate 61 and the p-type semiconductor layer 63p, it is possible to suppress a dark current that flows into the charge accumulation region 67n.

The p-type semiconductor layer 63p is provided closer to the front surface of the semiconductor substrate 60 than the n-type semiconductor layer 62n is. A p-type impurity included in the p-type semiconductor layer 63p is, for example, boron. Specifically, the p-type semiconductor layer 63p is provided so as to be in contact with the upper surface of the n-type semiconductor layer 62n. More specifically, the p-type semiconductor layer 63p is formed substantially across the entire surface of the support substrate 61.

The p-type semiconductor layer 65p is provided closer to the front surface of the semiconductor substrate 60 than the p-type semiconductor layer 63p is. Specifically, the p-type semiconductor layer 65p is provided so as to be in contact with the upper surface of the p-type semiconductor layer 63p. A p-type impurity included in the p-type semiconductor layer 65p is, for example, boron.

The n-type semiconductor layer 62n, p-type semiconductor layer 63p, and p-type semiconductor layer 65p are typically formed by ion implantation of an impurity into a semiconductor film formed by epitaxial growth.

Impurity regions are allocated in the p-type semiconductor layer 65p in the semiconductor substrate 60. Specifically, the p-type semiconductor layer 65p includes a charge accumulation region 67n, an impurity region 68an, an impurity region 68bn, an impurity region 68cn, an impurity region 68dn, an impurity region 68en, and an impurity region 68fn. In addition, the p-type semiconductor layer 65p in the semiconductor substrate 60 includes an element isolation region 69.

The charge accumulation region 67n is an example of a first impurity region of a first conductivity type that is positioned in the semiconductor substrate 60 and is connected to the photoelectric converter 12. In this example, the first conductivity type is the n-type. An n-type impurity is included in the charge accumulation region 67n. An example of an n-type impurity is phosphorus. The n-type charge accumulation region 67n is formed in the vicinity of the front surface of the semiconductor substrate 60. At least part of the charge accumulation region 67n is positioned in the front surface of the semiconductor substrate 60. Here, the charge accumulation region 67n includes a first region 67a and a second region 67b positioned in the first region 67a, the second region 67b having a higher impurity density than the first region 67a. The impurity density in the first region 67a is, for example, about $1 \times 10^{17}$ cm$^{-3}$, and the impurity density in the second region 67b is, for example, about $3 \times 10^{18}$ cm$^{-3}$, where the symbol × indicates a multiplication.

The impurity region 68an, impurity region 68bn, impurity region 68cn, impurity region 68dn, impurity region 68en, and impurity region 68fn are each an n-type impurity region. The impurity region 68an, impurity region 68bn, impurity region 68cn, impurity region 68dn, impurity region 68en, and impurity region 68fn are each the source or drain of a transistor included in the signal detection circuit 14 in the imaging device 100. The impurity densities in the impurity region 68an, impurity region 68bn, impurity region 68cn, impurity region 68dn, impurity region 68en, and impurity region 68fn are higher than the impurity density in the first region 67a in the charge accumulation region 67n. At least one of the impurity region 68an, impurity region 68bn, impurity region 68cn, impurity region 68dn, impurity region 68en, and impurity region 68fn may include a first region including an n-type impurity and a second region positioned in the first region, the second region having a higher impurity density than the first region, as in the charge accumulation region 67n.

An insulating layer is provided on the front surface of the semiconductor substrate 60. In the example illustrated in FIG. 3, the main surface of the semiconductor substrate 60 on the same side as the photoelectric converter 12 is covered by a first insulating layer 71, a second insulating layer 72, and a third insulating layer 73. The first insulating layer 71 is, for example, a thermally-oxidized film of silicon. The second insulating layer 72 is, for example, a silicon dioxide layer. The third insulating layer 73 is, for example, a silicon nitride layer. The second insulating layer 72 may have a multilayer structure including insulating layers. Similarly, the third insulating layer 73 may also have a multilayer structure including insulating layers.

The multilayer structure constituted by the first insulating layer 71, second insulating layer 72, and third insulating layer 73 includes a contact hole h1, a contact hole h2, a contact hole h3, a contact hole h4, and a contact hole h5. That is, the contact hole h1, contact hole h2, contact hole h3, contact hole h4, and contact hole h5 pass through the multilayer structure constituted by the first insulating layer 71, second insulating layer 72, and third insulating layer 73. For example, the contact hole h1 is formed on the second region 67b in the charge accumulation region 67n; the contact hole h2 is formed on the impurity region 68an; the contact hole h3 is formed on the impurity region 68bn; the contact hole h4 is formed on the impurity region 68dn; and the contact hole h5 is formed on the impurity region 68fn.

In the example in FIG. 3, a plug Cp1a, which is part of the conductive structure 89, is formed in the contact hole h1 and is connected to the second region 67b. Thus, the charge accumulation region 67n is electrically connected to the pixel electrode 12a of the photoelectric converter 12 through the conductive structure 89. Signal charge generated in the photoelectric converter 12 is accumulated in the charge accumulation region 67n.

A junction capacitor formed by pn junction between the n-type charge accumulation region 67n and the p-type semiconductor layer 65p formed as a p-well functions as a charge accumulation region that temporarily holds signal charge. It can be said that the conductive structure 89 and n-type charge accumulation region 67n constitute at least part of the charge accumulation node FD described above.

The second region 67b is not necessarily formed in the charge accumulation region 67n. However, if the second region 67b has a relatively high impurity density, when the plug Cp1a is connected to the second region 67b, the effect of reducing the contact resistance is obtained.

The signal detection circuit 14 is formed on the semiconductor substrate 60. As described above, the signal detection circuit 14 includes the signal detection transistor 22, address transistor 24, reset transistor 26, and protective transistor 27. The signal detection circuit 14 is electrically separated from the signal detection circuits 14 in adjacent pixels 10 by element isolation regions 69.

The signal detection transistor 22 includes the impurity region 68bn as one of the source and drain, and also includes the impurity region 68cn as the other of the source and drain. The signal detection transistor 22 further includes a gate electrode 22e provided on the first insulating layer 71. A portion, positioned between the gate electrode 22e and the semiconductor substrate 60, of the first insulating layer 71 functions as a gate insulating film of the signal detection transistor 22. In this embodiment, although not illustrated in FIG. 3, the gate electrode 22e is connected to the pixel electrode 12a and charge accumulation region 67n through the conductive structure 89. For example, in the layers in which the address signal line 34 and reset signal line 36 are positioned, the gate electrode 22e is connected to a portion, in the conductive structure 89, at which the pixel electrode 12a and plug Cp1a are mutually connected.

A contact plug Cp3 is connected to the impurity region 68bn. Part of the contact plug Cp3 is positioned in the contact hole h3. The power supply line 32 described above, which is used as a source follower power supply, is electrically connected to the contact plug Cp3. In FIG. 3, the power supply line 32 is not illustrated.

The address transistor 24 includes the impurity region 68en as one of the source and drain, and also includes the impurity region 68dn as the other of the source and drain. The address transistor 24 further includes a gate electrode 24e provided on the first insulating layer 71. A portion, positioned between the gate electrode 24e and the semiconductor substrate 60, of the first insulating layer 71 functions as a gate insulating film of the address transistor 24.

A contact plug Cp4 is connected to the impurity region 68dn. Part of the contact plug Cp4 is positioned in the contact hole h4. The contact plug Cp4 is electrically connected to the vertical signal line 35.

Figure 4:
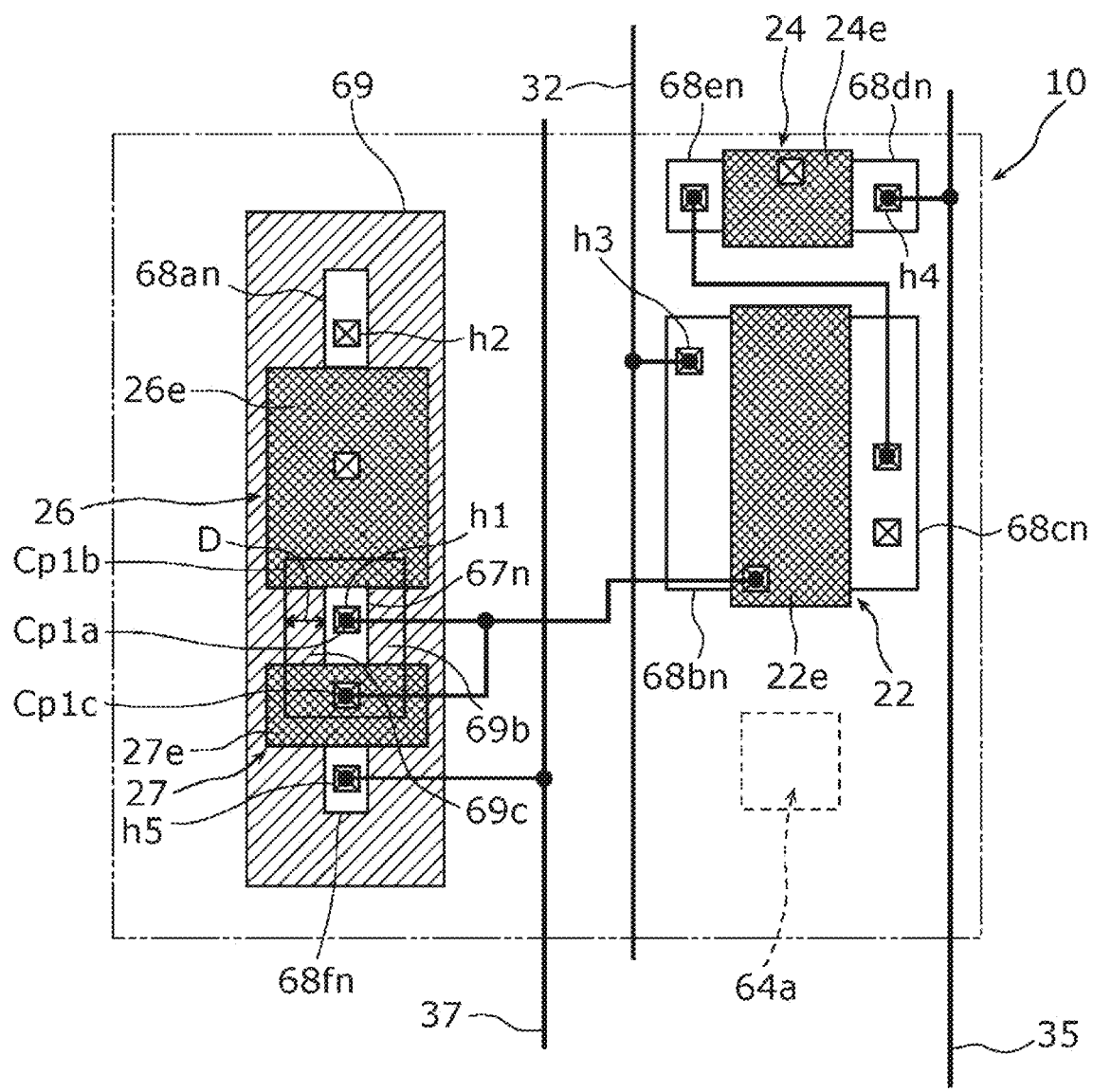
FIG. 4 is a plan view schematically illustrating an example of the layout of the elements in the pixel in the imaging device according to Embodiment 1 of the present disclosure.

The impurity region 68cn and impurity region 68en are provided in the semiconductor substrate 60 so that they are separated from each other and are electrically connected to each other through a wire, as illustrated in FIG. 4. However, this is not a limitation. The impurity region 68cn and impurity region 68en may be a single diffusion region that is continuous in the semiconductor substrate 60. That is, the signal detection transistor 22 and address transistor 24 may share a single diffusion region. The signal detection transistor 22 and address transistor 24 are thereby electrically connected to each other.

The reset transistor 26 is an example of a first transistor that includes the n-type charge accumulation region 67n as one of the source and drain, and has a first gate. Specifically, the reset transistor 26 includes the charge accumulation region 67n as one of the drain and source, and also includes the n-type impurity region 68an as the other of the source and drain. The reset transistor 26 further includes a gate electrode 26e provided on the first insulating layer 71. The gate electrode 26e is an example of the first gate included in the first transistor. A portion, positioned between the gate electrode 26e and the semiconductor substrate 60, of the first insulating layer 71 functions as a gate insulating film of the reset transistor 26. As illustrated in FIG. 4, a pad Cp1b overlaps the gate electrode 26e in plan view. The pad Cp1b is connected directly to the plug Cp1c.

The impurity region 68an is connected to a contact plug Cp2 as illustrated in FIG. 3. Part of the contact plug Cp2 is positioned in the contact hole h2. The contact plug Cp2 is electrically connected to the feedback line 53.

The protective transistor 27 is an example of a second transistor that includes the n-type charge accumulation region 67n as one of the source and drain and has a second gate. Specifically, the protective transistor 27 includes the n-type charge accumulation region 67n as one of the drain and source, and also includes the n-type impurity region 68fn as the other of the source and drain. The protective transistor 27 further includes a gate electrode 27e provided on the first insulating layer 71. The gate electrode 27e is an example of the second gate that overlaps the charge accumulation region 67n in plan view. The charge accumulation region 67n and gate electrode 27e are electrically connected to each other through the plug Cp1a, pad Cp1b, and plug Cp1c. That is, the charge accumulation region 67n and gate electrode 27e are at the same potential. As illustrated in FIG. 4, the pad Cp1b overlaps the gate electrode 27e in plan view.

The impurity region 68fn is connected to a contact plug Cp5 as illustrated in FIG. 3. Part of the contact plug Cp5 is positioned in the contact hole h5. The impurity region 68fn is connected to the power supply line 37 through the contact plug Cp5. In FIG. 3, the power supply line 37 is not illustrated.

The element isolation region 69 is disposed around the reset transistor 26 and protective transistor 27 as illustrated in FIG. 4. In the semiconductor substrate 60, the sources and drains of the reset transistor 26 and protective transistor 27 are electrically separated from the sources and drains of the transistors, including the signal detection transistor 22 and address transistor 24, by the element isolation region 69.

The element isolation region 69 is positioned in the semiconductor substrate 60. Specifically, the element isolation region 69 is a p-type diffusion area. The element isolation region 69 is formed in the vicinity of the front surface of the semiconductor substrate 60. At least part of the element isolation region 69 is positioned in the front surface of the semiconductor substrate 60. Here, as illustrated in FIG. 4, the element isolation region 69 is provided so as to enclose the charge accumulation region 67n, impurity region 68an, and impurity region 68fn in plan view. The element isolation region 69 is formed by ion implantation of an impurity into a semiconductor substrate formed by epitaxial growth. The impurity density in the element isolation region 69 is, for example, about $5 \times 10^{17}$ cm$^{-3}$, where the symbol × indicates a multiplication.

As illustrated in FIG. 4, the element isolation region 69 includes a second portion 69b and a third portion 69c.

The second portion 69b and third portion 69c are positioned in the semiconductor substrate 60. The third portion 69c is positioned opposite to the second portion 69b with respect to the charge accumulation region 67n. Specifically, the second portion 69b and third portion 69c are positioned between the gate electrode 26e and the gate electrode 27e and provided with the charge accumulation region 67n interposed between them in plan view.

The second portion 69b and third portion 69c are each an impurity region of a second conductivity type different from the first conductivity type. In this example, the second conductivity type is the p-type. The second portion 69b and third portion 69c include a p-type impurity. An example of a p-type impurity is boron.

Now, the structures of the pad Cp1a, pad Cp1b, and plug Cp1c will be described specifically, with respect to FIGS. 3 and 4. In FIG. 3, an example of a boundary between the plug Cp1a and the pad Cp1b and an example of a boundary between the plug Cp1c and the pad Cp1b are indicated by broken lines.

The plug Cp1a includes a first semiconductor. The plug Cp1a is positioned in the contact hole h1 and is connected directly to the charge accumulation region 67n. The plug Cp1a is provided so as to, for example, fill the interior of the contact hole h1. The plug Cp1a passes through the first insulating layer 71, second insulating layer 72, and third insulating layer 73, and physically and electrically connects the charge accumulation region 67n and pad Cp1b together directly.

The pad Cp1b includes a second semiconductor. The pad Cp1b is provided on the upper surface of the third insulating layer 73 and is connected directly to the plug Cp1a. A plug is connected to the pad Cp1b, the plug being electrically connected to the photoelectric converter 12 and passing through the insulating layers included in the insulating interlayer 90 in its thickness direction.

The plug Cp1c includes a third semiconductor. The plug Cp1c is connected directly to the gate electrode 27e. For example, the plug Cp1c is positioned so as to overlap the gate electrode 27e in plan view, passes through the second insulating layer 72 and third insulating layer 73, and physically and electrically connects the pad Cp1b and gate electrode 27e together directly.

The first semiconductor, second semiconductor, and third semiconductor have conductivity. The first semiconductor, second semiconductor, and third semiconductor are each, for example, polysilicon to which an impurity is added. An example of an impurity added to polysilicon is an n-type impurity, but may be a p-type impurity. An example of an n-type impurity is phosphorus. An example of a p-type impurity is boron. In this embodiment, the plug Cp1a, pad Cp1b, and plug Cp1c are formed from polysilicon to which conductivity is added. The plug Cp1a, pad Cp1b, and plug Cp1c may be formed from different materials. That is, the first semiconductor, second semiconductor, and third semiconductor may be different from one another.

In this embodiment, the pad Cp1b overlaps the gate electrode 26e and gate electrode 27e in plan view, as illustrated in FIG. 4. In FIG. 4, the outline of the pad Cp1b is indicated by the frame of a solid-line rectangle. This is also true in FIGS. 6 and 8, which will be referenced later.

The pad Cp1b further overlaps the second portion 69b and third portion 69c. Specifically, the pad Cp1b completely covers the charge accumulation region 67n. That is, the charge accumulation region 67n is positioned inside the pad Cp1b in plan view. In other words, the ends of the pad Cp1b are not positioned immediately above the charge accumulation region 67n.

In this embodiment, the pad Cp1b may completely cover the charge accumulation region 67n and a depletion layer extending from the charge accumulation region 67n in plan view. The distance D in FIG. 4 is a distance between a point on the outline of the pad Cp1b and the point, on the outline of the charge accumulation region 67n, closest to the point on the outline of the pad Cp1b. For example, the distance D is longer than a distance over which the depletion layer extends in the vicinity of the charge accumulation region 67n. That is, the pad Cp1b is provided so that the depletion layer extending from the charge accumulation region 67n does not extend beyond the pad Cp1b. The distance over which the depletion layer extends is a distance when the depletion layer extends in the dark. Specifically, the distance is the one over which the depletion layer extends in a state in which a bias voltage of 0.5 V is applied to the support substrate 61 for the semiconductor substrate 60. The distance D is, for example, more than or equal to 55 nm and less than or equal to 130 nm. However, the distance is not limited to a value within this range. The distance D may be 0 nm. The outlines of the charge accumulation region 67n and pad Cp1b may match at least partially in plan view. The shapes and sizes of the charge accumulation region 67n and pad Cp1b may completely match in plan view.

As described above, in this embodiment, the charge accumulation region 67n is covered by the pad Cp1b. Therefore, since the charge accumulation region 67n is covered by a material including a semiconductor when the pad Cp1b is patterned by using a dry etching apparatus, the charge accumulation region 67n is less likely to be exposed directly to plasma. This suppresses generation of small crystal defects generated in the charge accumulation region 67n due to plasma damage. Therefore, it is possible to reduce dark current that flows into or out of the charge accumulation region 67n.

In this embodiment, the longer the distance D in FIG. 4 is, the less likely crystal defects are to be formed in the charge accumulation region 67n and a depletion layer extending from the charge accumulation region 67n. Therefore, it is possible to reduce dark current that flows into or out of the charge accumulation region 67n. That is, there is a negative correlation between the distance D and the magnitude of dark current.

Embodiment 2

Next, Embodiment 2 will be described, focusing on differences from Embodiment 1. Descriptions common to Embodiments 1 and 2 will be omitted or simplified.

Figure 5:
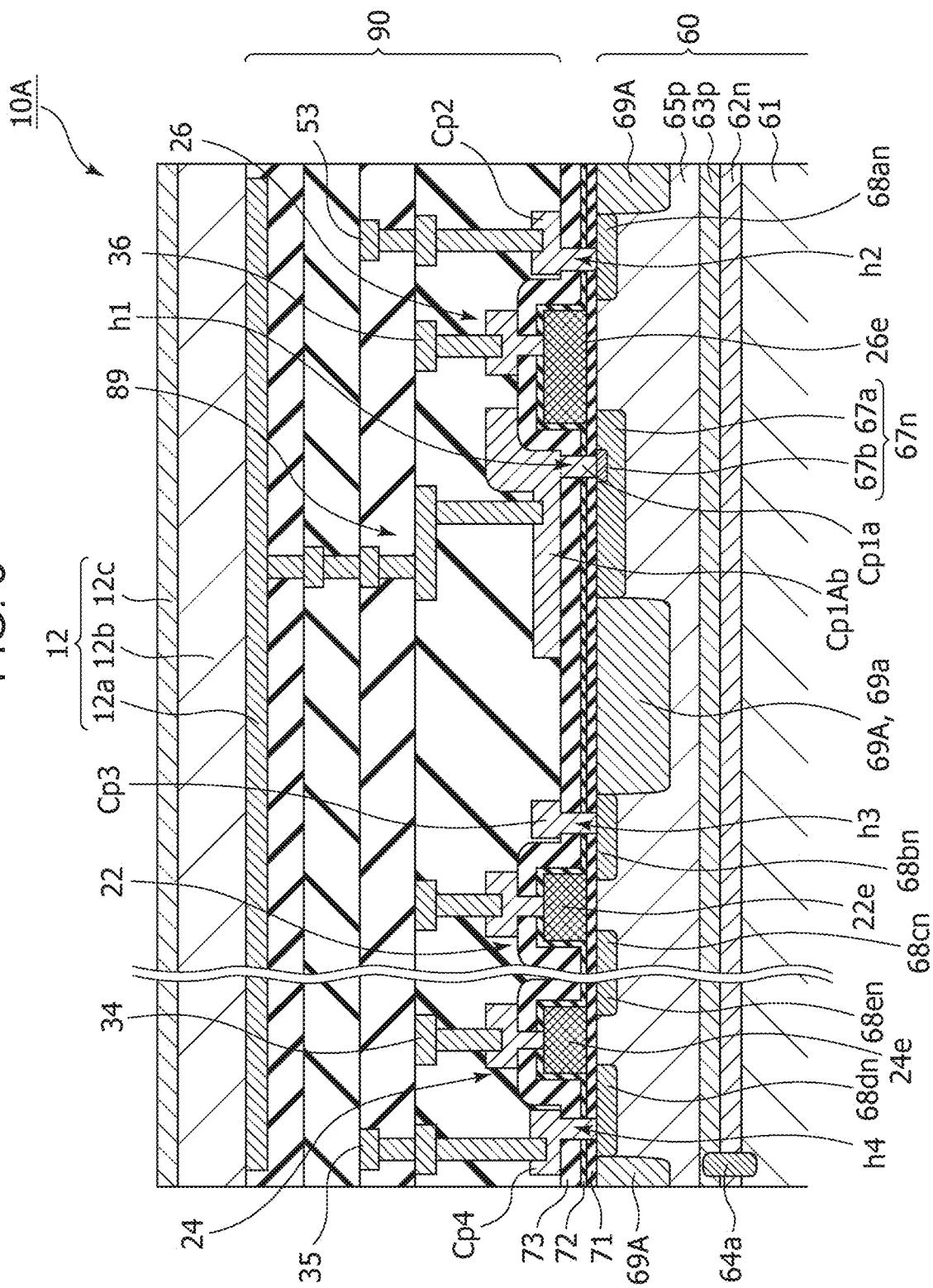
FIG. 5 is a sectional view schematically illustrating an example of the device structure of a pixel in an imaging device according to Embodiment 2 of the present disclosure.
Figure 6:
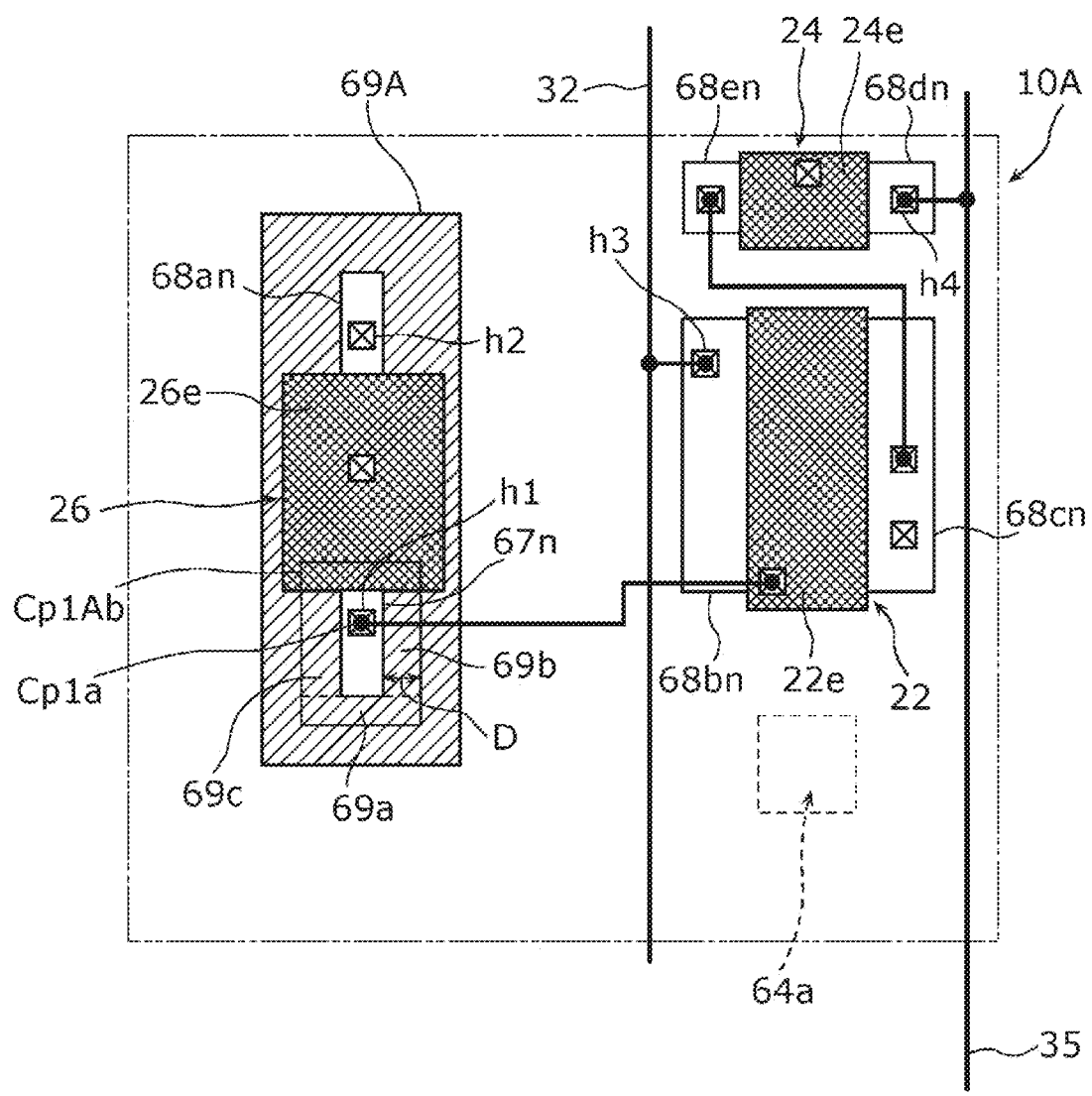
FIG. 6 is a plan view schematically illustrating an example of the layout of the elements in the pixel in the imaging device according to Embodiment 2 of the present disclosure.

FIG. 5 is a sectional view schematically illustrating an example of the device structure of a pixel 10A in an imaging device according to this embodiment. FIG. 6 is a plan view schematically illustrating an example of the layout of the elements in the pixel 10A in the imaging device according to Embodiment 2.

The pixel 10A in FIG. 5 differs from the pixel 10 in FIG. 3 mainly in that the pixel 10A does not have the protective transistor 27 and that pixel 10A has an element isolation region 69A and a pad Cp1Ab instead of the element isolation region 69 and pad Cp1b. Specifically, the element isolation region 69A includes a first portion 69a. The first portion 69a is positioned in the semiconductor substrate 60 so as to be opposite to the gate electrode 26e with respect to the charge accumulation region 67n. The first portion 69a is in contact with the second portion 69b and third portion 69c. The first portion 69a is an impurity region of the second conductivity type different from the first conductivity type. The second conductivity type is the p-type. The first portion 69a includes a p-type impurity. An example of a p-type impurity is boron.

In plan view, the gate electrode 26e is positioned in a first direction of the charge accumulation region 67n and the first portion 69a is positioned in a second direction of the charge accumulation region 67n, as illustrated in FIG. 6. The second direction is opposite to the first direction. In the example in FIG. 6, the first direction is upward on the drawing and the second direction is downward on the drawing. In this case, in plan view, the second portion 69b is positioned in a third direction of the charge accumulation region 67n and the third portion 69c is positioned in a fourth direction of the charge accumulation region 67n. The fourth direction is opposite to the third direction. The third direction and fourth direction cross the first direction. For example, the third direction and fourth direction are orthogonal to the first direction. In the example in FIG. 6, the third direction is leftward on the drawing and the fourth direction is rightward on the drawing.

The pad Cp1Ab includes the second semiconductor. The pad Cp1Ab is provided on the upper surface of the third insulating layer 73 and is connected directly to the plug Cp1a. A plug is connected to the pad Cp1Ab, the plug being electrically connected to the photoelectric converter 12 and passing through the insulating layers included in the insulating interlayer 90 in its thickness direction. The pad Cp1Ab is formed from, for example, polysilicon to which conductivity is added.

In this embodiment, the pad Cp1 Ab overlaps the gate electrode 26e and first portion 69a in plan view, as illustrated in FIG. 6. The pad Cp1Ab further overlaps the second portion 69b and third portion 69c. Specifically, the pad Cp1Ab completely covers the charge accumulation region 67n. In FIG. 6, an example of a boundary between the first portion 69a and the second portion 69b and an example of a boundary between the first portion 69a and the third portion 69c are indicated by broken lines.

As described above, in this embodiment, the charge accumulation region 67n is covered by the pad Cp1Ab as in Embodiment 1. Therefore, effects similar to effects in Embodiment 1 are obtained.

If the imaging device is operated in an application in which high-intensity light is not incident on the photoelectric converter 12, holes accumulated in the charge accumulation node FD decrease. This reduces the possibility that the gate oxide film of the signal detection transistor 22 connected to the charge accumulation node FD is broken. In this case, the protective transistor 27 may not be provided as in this embodiment. When the protective transistor 27 is not provided, the area of the pixel 10A can be reduced.

Embodiment 3

Next, Embodiment 3 will be described, focusing on differences from Embodiment 1 or 2. Descriptions common to Embodiment 1 or 2 and Embodiment 3 will be omitted or simplified.

Figure 7:
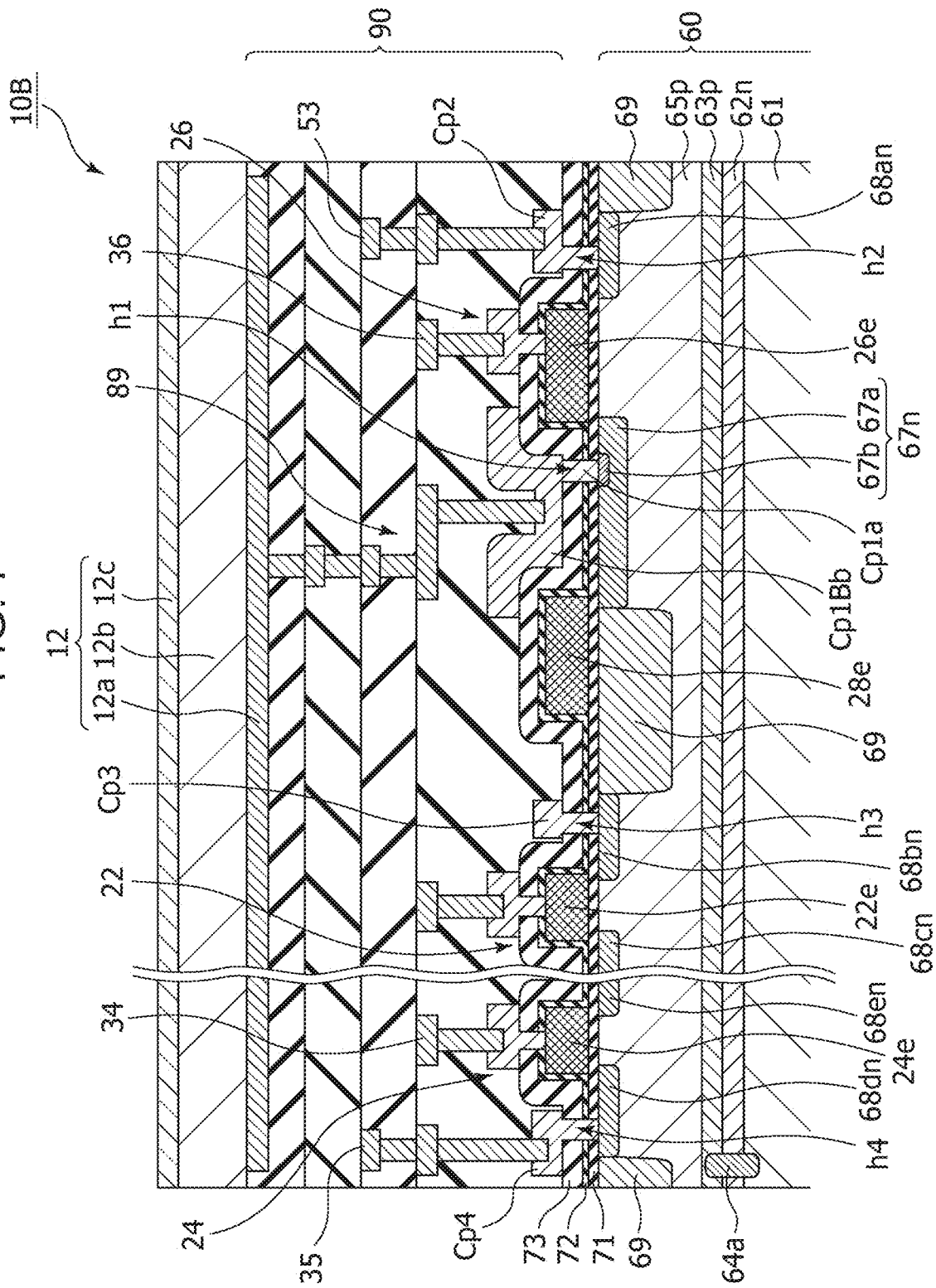
FIG. 7 is a sectional view schematically illustrating an example of the device structure of a pixel in an imaging device according to Embodiment 3 of the present disclosure.
Figure 8:
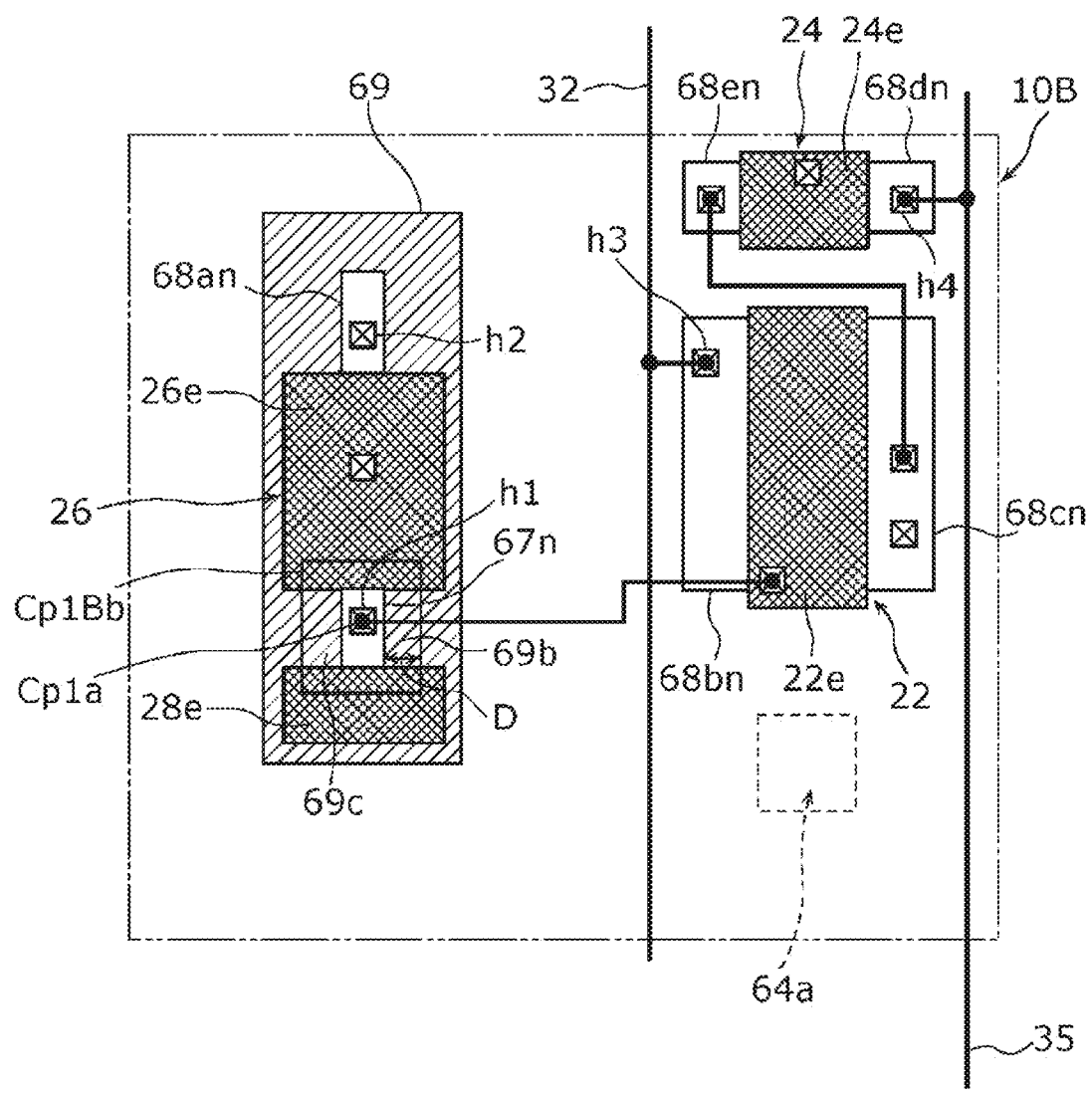
FIG. 8 is a plan view schematically illustrating an example of the layout of the elements in the pixel in the imaging device according to Embodiment 3 of the present disclosure.

FIG. 7 is a sectional view schematically illustrating an example of the device structure of a pixel 10B in an imaging device according to this embodiment. FIG. 8 is a plan view schematically illustrating an example of the layout of the elements in the pixel 10B in the imaging device according to Embodiment 2.

The pixel 10B in FIG. 7 differs from the pixel 10 in FIG. 3 mainly in that pixel 10B has a pad Cp1Bb and a second gate 28e instead of the pad Cp1b and protective transistor 27.

The pad Cp1Bb includes the second semiconductor. The pad Cp1Bb is provided on the upper surface of the third insulating layer 73 and is connected directly to the plug Cp1a. A plug is connected to the pad Cp1Bb, the plug being electrically connected to the photoelectric converter 12 and passing through the insulating layers included in the insulating interlayer 90 in its thickness direction. The pad Cp1Bb is formed from, for example, polysilicon to which conductivity is added.

The second gate 28e overlaps the charge accumulation region 67n in plan view. The second gate 28e is formed from a semiconductor having conductivity. The second gate 28e is formed from, for example, polysilicon to which conductivity is added. The second gate 28e may be, for example, part of the gate electrode 26e of the reset transistor 26. That is, the second gate 28e may be electrically connected to the gate electrode 26e through a wire or may be formed integrally with the gate electrode 26e. For example, the gate electrode 26e and second gate 28e may be connected together through polysilicon to which conductivity is added. Alternatively, the second gate 28e may be part of the gate electrode of another transistor or may be part of another wire. The second gate 28e may not be connected to either another gate electrode or another wire.

The pad Cp1Bb is electrically insulated from the second gate 28e by the second insulating layer 72 and third insulating layer 73.

In this embodiment, the pad Cp1Bb overlaps the gate electrode 26e and second gate 28e in plan view, as illustrated in FIG. 8. The pad Cp1Bb further overlaps the second portion 69b and third portion 69c. Specifically, the pad Cp1Bb completely covers the charge accumulation region 67n.

In plan view, the gate electrode 26e is positioned in the first direction of the charge accumulation region 67n and the second gate 28e is positioned in the second direction of the charge accumulation region 67n, as illustrated in FIG. 8. The second direction is opposite to the first direction. In the example in FIG. 8, the first direction is upward on the drawing and the second direction is downward on the drawing. In this case, in plan view, the second portion 69b is positioned in the third direction of the charge accumulation region 67n and the third portion 69c is positioned in the fourth direction of the charge accumulation region 67n, as in Embodiment 2.

If the imaging device is operated in an application in which high-intensity light is not incident on the photoelectric converter 12 as in Embodiment 2, holes accumulated in the charge accumulation node FD decrease. This eliminates the fear that the gate oxide film of the signal detection transistor 22 connected to the charge accumulation node FD is broken. When the protective transistor 27 is not provided, the area of the pixel 10B can be reduced.

In this case, the second gate 28e overlapping the charge accumulation region 67n in plan view is provided and the pad Cp1Bb overlaps the second gate 28e, in this embodiment. That is, in this embodiment, the charge accumulation region 67n is covered by the pad Cp1Bb as in Embodiment 1. Therefore, effects similar to effects in Embodiment 1 are obtained.

Figure 9:
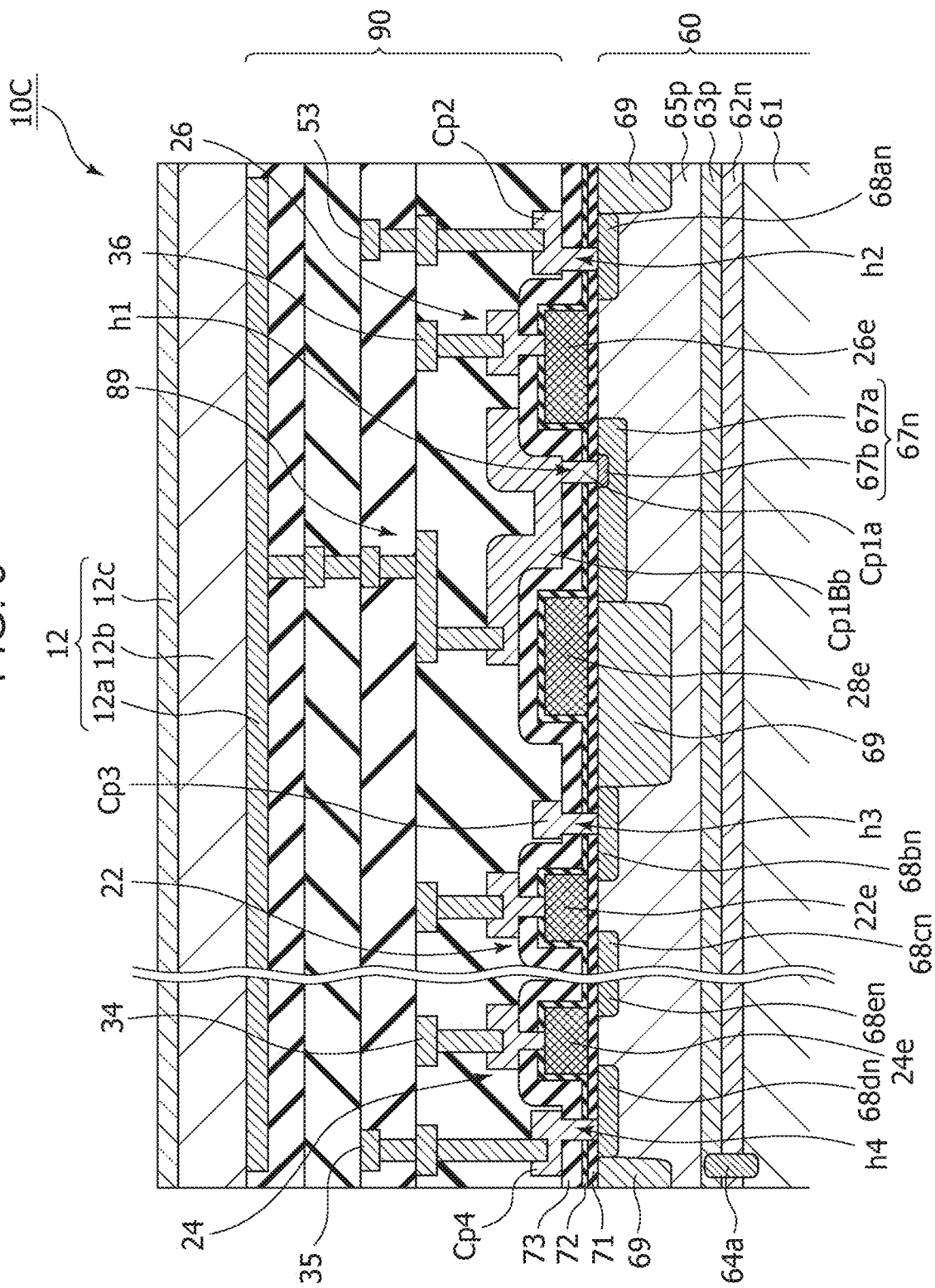
FIG. 9 is a sectional view schematically illustrating an example of the device structure of another pixel in the imaging device according to Embodiment 3 of the present disclosure.

In this embodiment, a portion at which the conductive structure 89 and pad Cp1Bb are connected together is positioned above the charge accumulation region 67n as illustrated in FIG. 7. However, this is not a limitation. For example, the portion at which the conductive structure 89 and pad Cp1Bb are connected together may be positioned so that the portion does not overlap the charge accumulation region 67n in plan view. For example, the portion at which the conductive structure 89 and pad Cp1Bb are connected together may be positioned so that the portion does not overlap the second region 67b in plan view. For example, the portion at which the conductive structure 89 and pad Cp1Bb are connected together may be positioned above the second gate 28e as in a pixel 10C illustrated in FIG. 9. The portion at which the conductive structure 89 and pad Cp1Bb are connected together is positioned inside the second gate 28e in plan view. The pad Cp1Bb is electrically insulated from the second gate 28e by the second insulating layer 72 and third insulating layer 73.

Thus, it is possible to suppress plasma damage to the impurity regions in the substrate during the machining of the pad Cp1Bb. It is also possible to assure an adequate distance between the pad Cp1Bb and a plug close to it according to the layout of the elements.

Variations

Next, variations of the embodiments described above will be described. In an imaging device in each variation, side walls are provided in the lateral direction of a gate electrode unlike the imaging devices in the embodiments. Descriptions common to the embodiments and variations will be omitted or simplified.

First, Variation 1 will be described with reference to FIG. 10.

Figure 10:
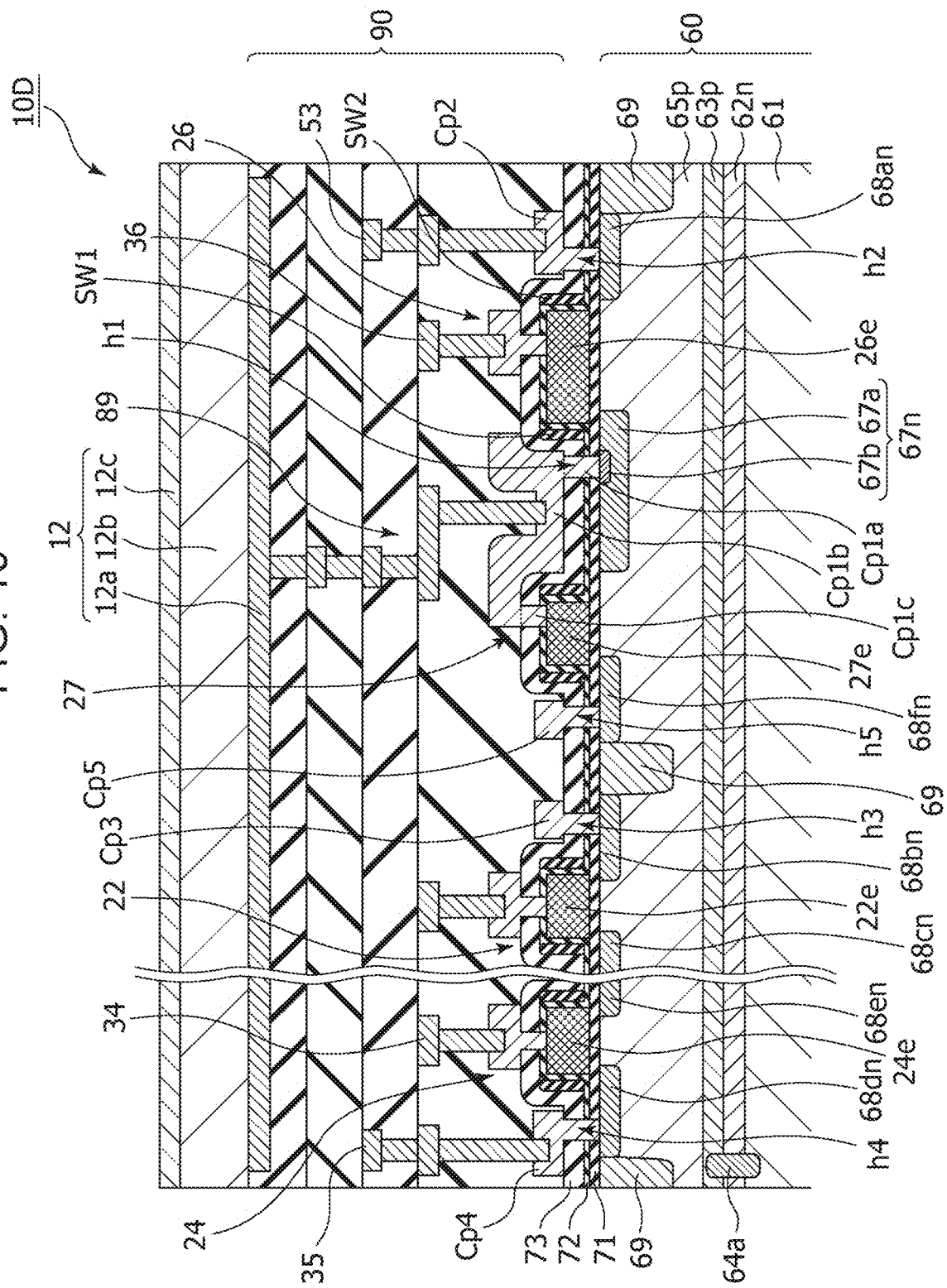
FIG. 10 is a sectional view schematically illustrating an example of the device structure of a pixel in an imaging device according to Variation 1 of the present disclosure.

FIG. 10 is a sectional view schematically illustrating an example of the device structure of a pixel 10D in an imaging device according to Variation 1. As illustrated in FIG. 10, the pixel 10D has a side wall SW1 and a side wall SW2 that are positioned in the lateral direction of the gate electrode 26e unlike the pixel 10 in FIG. 3. The lateral direction refers to a direction parallel to the main surface of the semiconductor substrate 60.

The side wall SW1 and side wall SW2 are formed so as to cover the end faces of the gate electrode 26e. Specifically, the side wall SW1 is formed so as to cover the end face of the gate electrode 26e on the same side as the charge accumulation region 67n, and the side wall SW2 is formed so as to cover the end face of the gate electrode 26e on the same side as the impurity region 68an, the end face being opposite to the end face covered by the side wall SW1. The side wall SW1 and side wall SW2 are formed so as to enclose the entire circumference of the gate electrode 26e in plan view. That is, the side wall SW1 and side wall SW2 each are equivalent to part of a side wall formed in a ring shape. The side wall SW1 and side wall SW2 are formed by using, for example, an insulating film such as a silicon nitride film. Side walls are similarly formed around the gate electrode 22e, gate electrode 24e, and gate electrode 27e, as illustrated in FIG. 10.

In Variation 1, the end face of the pad Cp1b is positioned immediately above the side wall SW1 as illustrated in FIG. 10 and FIG. 13A, which will be referenced later. That is, the pad Cp1b overlaps the side wall SW1, charge accumulation region 67n, and gate electrode 27e in plan view. The pad Cp1b does not overlap the gate electrode 26e in plan view. That is, part of the outline of the pad Cp1b is positioned inside the side wall SW1 in plan view.

In Variation 1 as well, most of the charge accumulation region 67n is covered by the pad Cp1b. Therefore, it is possible to suppress plasma damage to the charge accumulation region 67n during the patterning of the pad Cp1b.

Next, Variation 2 will be described with reference to FIG. 11.

Figure 11:
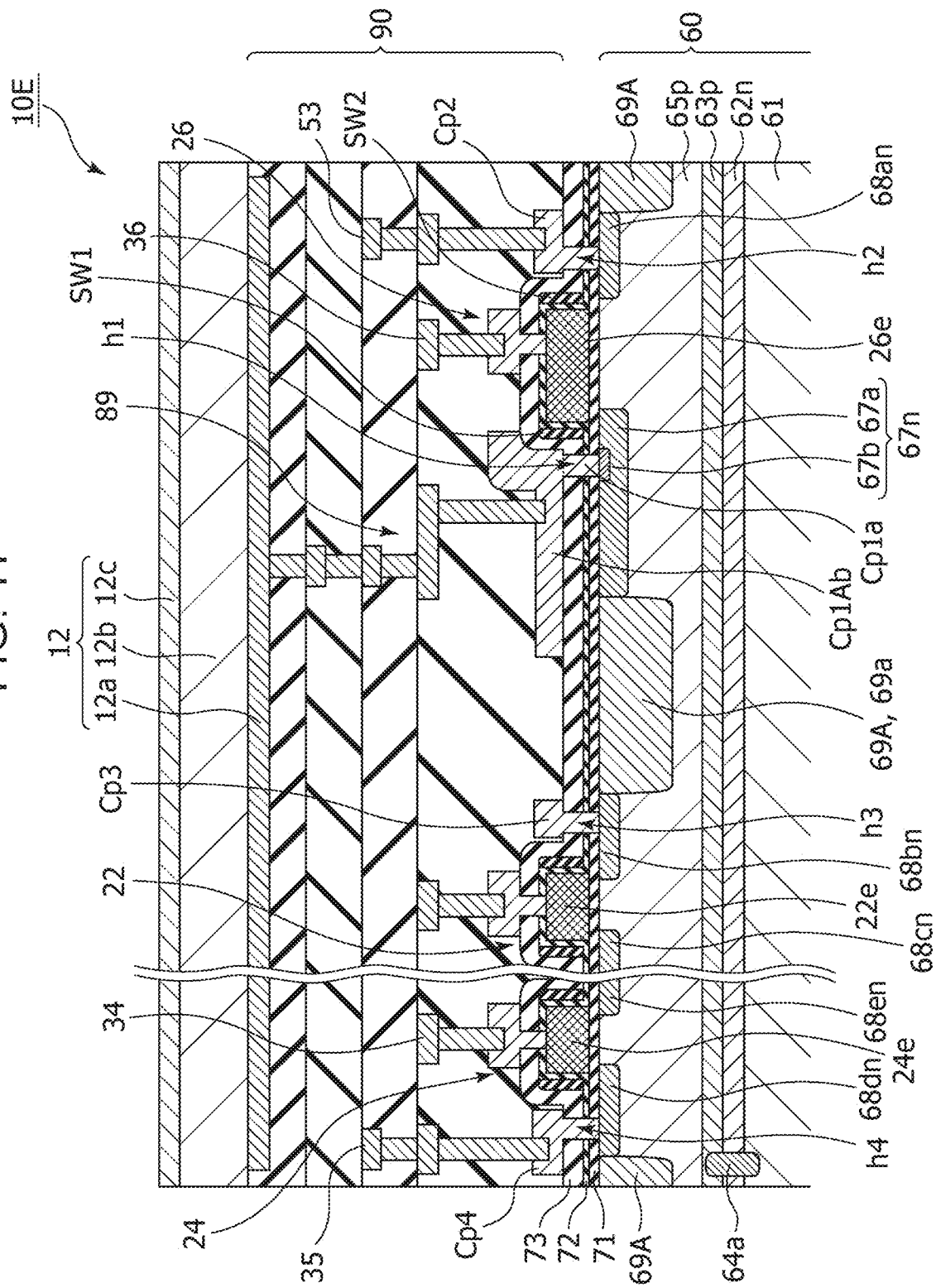
FIG. 11 is a sectional view schematically illustrating an example of the device structure of a pixel in an imaging device according to Variation 2 of the present disclosure.

FIG. 11 is a sectional view schematically illustrating an example of the device structure of a pixel 10E in an imaging device according to Variation 2. As illustrated in FIG. 11, the pixel 10E differs from the pixel 10A in FIG. 5 in that the pixel 10E has a side wall SW1 and a side wall SW2 that are positioned in the lateral direction of the gate electrode 26e. The side wall SW1 and side wall SW2 are similar to those in Variation 1.

In Variation 2, the end face of the pad Cp1Ab is positioned immediately above the side wall SW1 as illustrated in FIG. 11. That is, the pad Cp1Ab overlaps the side wall SW1, the charge accumulation region 67n, and the first portion 69a of the element isolation region 69A in plan view. The pad Cp1Ab does not overlap the gate electrode 26e in plan view. That is, part of the outline of the pad Cp1Ab is positioned inside the side wall SW1 in plan view.

In Variation 2 as well, most of the charge accumulation region 67n is covered by the pad Cp1Ab. Therefore, it is possible to suppress plasma damage to the charge accumulation region 67n during the patterning of the pad Cp1Ab.

Next, Variation 3 will be described with reference to FIG. 12.

Figure 12:
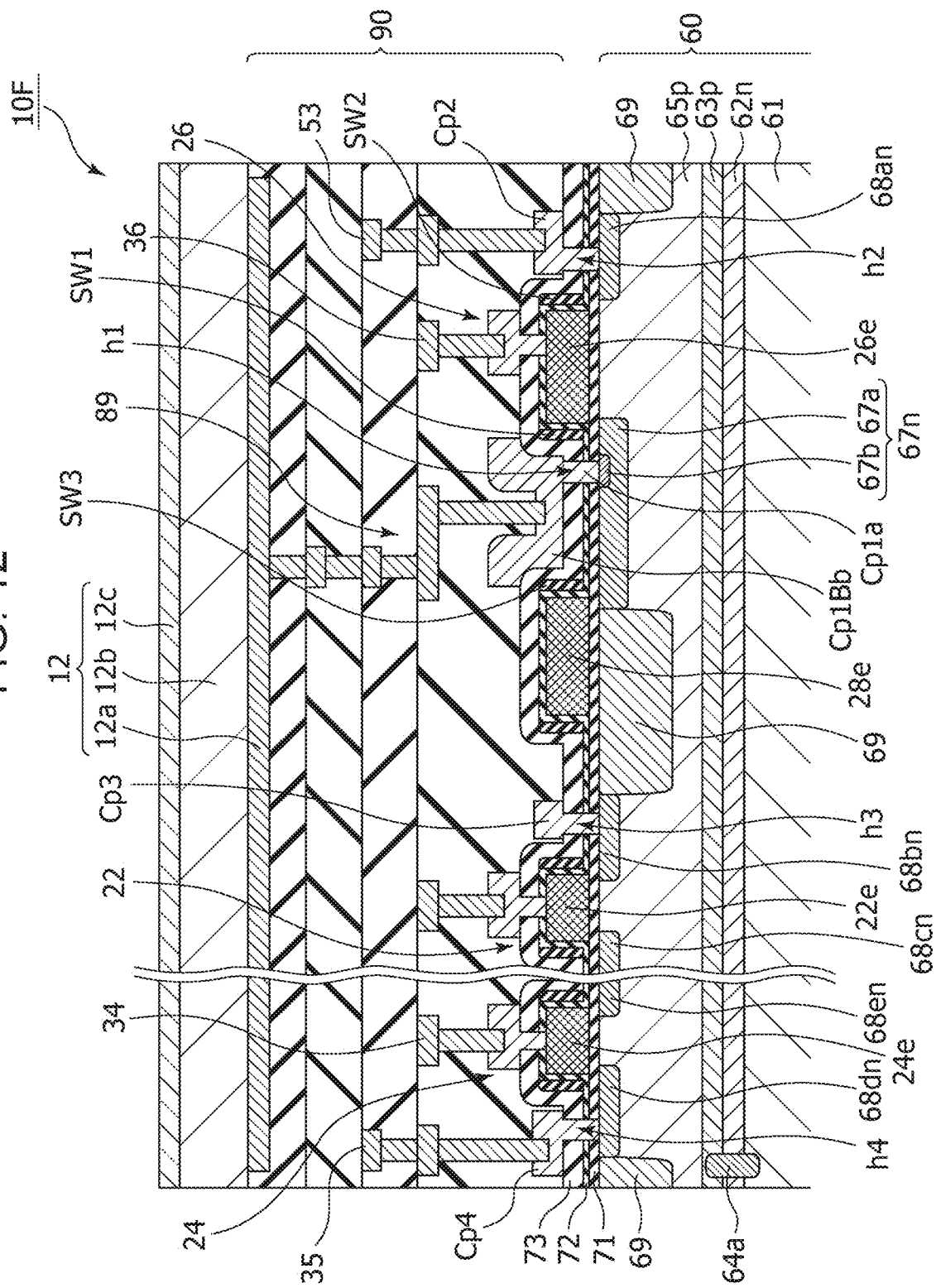
FIG. 12 is a sectional view schematically illustrating an example of the device structure of a pixel in an imaging device according to Variation 3 of the present disclosure.

FIG. 12 is a sectional view schematically illustrating an example of the device structure of a pixel 10F in an imaging device according to Variation 3. As illustrated in FIG. 12, the pixel 10F differs from the pixel 10B in FIG. 7 in that the pixel 10F has a side wall SW1 and a side wall SW2 that are positioned in the lateral direction of the gate electrode 26e and also has a side wall SW3 positioned in the lateral direction of the second gate 28e. The side wall SW1 and side wall SW2 are each an example of a first side wall; the side wall SW1 and side wall SW2 are similar to those in Variation 1. The side wall SW3 is an example of a second side wall; the side wall SW3 is similar to the side wall SW1.

In Variation 3, the end face of the pad Cp1Bb on the same side as the gate electrode 26e is positioned immediately above the side wall SW1 as illustrated in FIG. 12. The end face of the pad Cp1Bb on the same side as the second gate 28e is positioned immediately above the side wall SW3. That is, the pad Cp1Bb overlaps the side wall SW1, charge accumulation region 67n, and side wall SW3 in plan view. The pad Cp1Bb does not overlap either of the gate electrode 26e and second gate 28e in plan view. That is, one part of the outline of the pad Cp1Bb is positioned inside the side wall SW1 in plan view, and another part of the outline of the pad Cp1Bb is positioned inside the side wall SW3.

In Variation 3 as well, most of the charge accumulation region 67n is covered by the pad Cp1Bb. Therefore, it is possible to suppress plasma damage to the charge accumulation region 67n during the patterning of the pad Cp1Bb.

FIGS. 13A and 13B each are a sectional view referenced to explain the position of the end of a pad in the device structure of the pixel in the imaging device in each variation. As an example, FIG. 13A illustrates an enlarged view of the end of the pad Cp1b in FIG. 10 on the same side as the gate electrode 26e. As described above, the end face of the pad Cp1b is positioned immediately above the side wall SW1.

By comparison, the end face of the pad Cp1b may be positioned immediately above the gate electrode 26e as illustrated in FIG. 13B. That is, part of the outline of the pad Cp1b may be positioned inside the gate electrode 26e in plan view. As described above, a side wall may be positioned in the lateral direction of the gate electrode 26e, and an end face of the pad Cp1b may be positioned immediately above the gate electrode 26e as in Embodiment 1. This is also true for the pixels illustrated in FIGS. 11 and 12.

In each variation, the side walls may not be provided so as to enclose the entire circumference of the gate electrode 26e or second gate 28e. A side wall may not be formed in the side direction of at least one of the gate electrode 22e, gate electrode 24e, and gate electrode 27e.

Other Embodiments

So far, imaging devices in one or more aspects have been described according to the embodiments. However, the present disclosure is not limited to these embodiments. The range of the present disclosure includes embodiments in which various variations that a person having ordinary skill in the art thinks of are applied to the embodiments described above and also includes embodiments in which constituent elements in different embodiments are combined, without departing from the intended scope of the present disclosure.

For example, the whole or part of the element isolation region 69 may not be a region in which an impurity is not implanted. For example, at least one of the first portion 69a, second portion 69b, and third portion 69c included in the element isolation region 69 may have a shallow trench isolation (STI) structure. At least one of the first portion 69a, second portion 69b, and third portion 69c may be an insulative region. The element isolation region 69 may not have at least one of the first portion 69a, second portion 69b, and third portion 69c.

For example, the pad Cp1b, pad Cp1Ab, or pad Cp1Bb may not overlap one of the second portion 69b and third portion 69c or may overlap none of them.

For example, each of the signal detection transistor 22, address transistor 24, reset transistor 26, and protective transistor 27, which are included in the signal detection circuit 14, may be a P-channel MOSFET. If each transistor is a P-channel MOSFET, an impurity of the first conductivity type is a p-type impurity and an impurity of the second conductivity type is an n-type impurity. All of these transistors do not need to be a MOSFET of the same channel, that is, an N-channel MOSFET or a P-channel MOSFET. If each transistor in a pixel is an N-channel MOSFET and an electron is used as a signal charge, it is only necessary to exchange the dispositions of the source and drain of the transistor.

In the above embodiments, various changes, replacements, additions, omissions, and the like can be made within the scope of claims or the range of their equivalents.

The imaging device in the present disclosure is useful for, for example, an image sensor, a digital camera, and the like. The imaging device in the present disclosure can be used in, for example, a medical camera, a camera for a robot, a security camera, a vehicle-mounted camera, and the like.

What is claimed is:

1. An imaging device comprising:
   a photoelectric converter that converts incident light to charge;
   a semiconductor substrate that includes an element isolation region and a first impurity region of a first conductivity type, the first impurity region being electrically connected to the photoelectric converter;
   a plug that includes a first semiconductor, the plug being connected directly to the first impurity region;
   a pad that includes a second semiconductor, the pad being connected directly to the plug; and
   a first transistor that includes the first impurity region as one of a source and a drain and includes a first gate; wherein
   the first impurity region is positioned between the first gate and a first portion of the element isolation region in plan view, and
   the pad overlaps the first gate and the first portion in plan view.

2. The imaging device according to claim 1, wherein the element isolation region is an impurity region of a second conductivity type different from the first conductivity type.

3. The imaging device according to claim 1, wherein:
   the element isolation region further includes
   a second portion in contact with the first portion, and a third portion in contact with the first portion;

the first impurity region is positioned between the second portion and the third portion in plan view; and the pad overlaps the second portion and the third portion in plan view.

4. The imaging device according to claim 3, wherein in plan view, the first gate is positioned in a first direction of the first impurity region and the first portion is positioned in a second direction of the first impurity region, the second direction being opposite to the first direction, the second portion is positioned in a third direction of the first impurity region, the third direction crossing the first direction, and the third portion is positioned in a fourth direction of the first impurity region, the fourth direction being opposite to the third direction.

5. An imaging device comprising:

a photoelectric converter that converts incident light to charge;

a semiconductor substrate that includes an element isolation region and a first impurity region of a first conductivity type, the first impurity region being electrically connected to the photoelectric converter;

a plug that includes a first semiconductor, the plug being connected directly to the first impurity region;

a pad that includes a second semiconductor, the pad being connected directly to the plug;

a first transistor that includes the first impurity region as one of a source and a drain and includes a first gate; and a side wall positioned in a lateral direction of the first gate; wherein the first impurity region is positioned between the first gate and a first portion of the element isolation region in plan view, and the pad overlaps the side wall and the first portion in plan view.

* * * * *